US012660216B2

(12) United States Patent
Kim et al.

(10) Patent No.: US 12,660,216 B2
(45) Date of Patent: Jun. 16, 2026

(54) LOW-LEAKAGE SCHOTTKY DIODES AND METHOD OF MAKING A POWER SEMICONDUCTOR DEVICE

(71) Applicant: The Board of Trustees of the University of Illinois, Urbana, IL (US)

(72) Inventors: Kyekyoon Kim, Champaign, IL (US); Palash Sarker, Dallas, TX (US); Frank P. Kelly, Champaign, IL (US)

(73) Assignee: THE BOARD OF TRUSTEES OF THE UNIVERSITY OF ILLINOIS, Urbana, IL (US)

( * ) Notice: Subject to any disclaimer, the term of this patent is extended or adjusted under 35 U.S.C. 154(b) by 702 days.

(21) Appl. No.: 18/016,755

(22) PCT Filed: Jul. 30, 2021

(86) PCT No.: PCT/US2021/043989
§ 371 (c)(1),
(2) Date: Jan. 18, 2023

(87) PCT Pub. No.: WO2022/055632
PCT Pub. Date: Mar. 17, 2022

(65) Prior Publication Data
US 2023/0327027 A1      Oct. 12, 2023

Related U.S. Application Data

(60) Provisional application No. 63/059,481, filed on Jul. 31, 2020.

(51) Int. Cl.
*H10D 8/50* (2025.01)
*H01L 21/02* (2006.01)
(Continued)

(52) U.S. Cl.
CPC ......... *H10D 8/50* (2025.01); *H01L 21/02639* (2013.01); *H01L 21/0332* (2013.01);
(Continued)

(58) Field of Classification Search
None
See application file for complete search history.

(56) References Cited

U.S. PATENT DOCUMENTS 5,241,195  A       8/1993   Tu et al.
2008/0138953  A1    6/2008   Challa et al.
(Continued)

OTHER PUBLICATIONS

Anderson et al, "Improvements in the annealing of Mg ion implanted GaN and related devices," IEEE Trans. Semicond. Manuf., vol. 29, No. 4, Nov. 2016, pp. 343-348.
(Continued)

*Primary Examiner* — Jack S Chen
(74) *Attorney, Agent, or Firm* — Crowell & Moring LLP

(57) ABSTRACT

A method of fabricating a power semiconductor device includes forming a bi layer mask on a semiconductor substrate, where the bilayer mask comprises a first dielectric layer on the semiconductor substrate and a second dielectric layer on the first dielectric layer. The first and second dielectric layers are through-etched to define an exposed portion of the semiconductor substrate. The first dielectric layer is selectively etched to form an undercut region of the bi layer mask. A crystalline semiconductor material is epi-taxially grown on the exposed portion of the semiconductor substrate, and a polycrystalline semiconductor material is deposited on the second dielectric layer of the bilayer mask. After the epitaxial growth, the bilayer mask and the polycrystalline semiconductor material are removed from the semiconductor substrate, leaving behind a mesa com-prising the crystalline semiconductor material on the semi-
(Continued)

conductor substrate. Advantageously, a sidewall of the mesa is substantially smooth and/or defect-free.

14 Claims, 15 Drawing Sheets

(51) Int. Cl.

| | |
|---|---|
| *H01L 21/033* | (2006.01) |
| *H10D 8/60* | (2025.01) |
| *H10D 62/10* | (2025.01) |
| *H10D 62/85* | (2025.01) |

(52) U.S. Cl.
CPC ............. *H10D 8/60* (2025.01); *H10D 62/105* (2025.01); *H10D 62/8503* (2025.01)

(56) References Cited

U.S. PATENT DOCUMENTS

| | | |
|---|---|---|
| 2011/0062564 A1 | 3/2011 | Gruenhagen et al. |
| 2011/0095301 A1 | 4/2011 | Tarui |
| 2013/0062619 A1 | 3/2013 | Henning et al. |
| 2013/0075808 A1 | 3/2013 | Calafut et al. |
| 2014/0312355 A1 | 10/2014 | Kizilyalli et al. |
| 2022/0059709 A1* | 2/2022 | Cooper ................. H10D 62/106 |
| 2023/0327027 A1* | 10/2023 | Kim ..................... H10D 62/105 |
| | | 257/472 |

OTHER PUBLICATIONS

Anderson et al., "Activation of Mg implanted in GaN by multicycle rapid thermal annealing," Electron Lett., vol. 50, No. 3, Jan. 2014, pp. 197-198.

Chen et al., "Cathodoluminescence study of Mg implanted GaN: The impact of dislocation on Mg diffusion," Appl. Phys. Exp., vol. 12, No. 5, Apr. 2019, pp. 051010(1)-051010(5).

Cho et al., "Deep level characteristics in n-GaN with inductively coupled plasma damage," J. Phys. D: Appl. Phys., vol. 41, No. 15, Jul. 2008, pp. 155314(1)-155314(4).

Greenlee et al., "Symmetric multicycle rapid thermal annealing: Enhanced activation of implanted dopants in GaN," ECS J. Solid State Sci. Technol., vol. 4, No. 9, Aug. 2015, pp. P382-P386.

Hayashida et al., "Vertical GaN merged PiN Schottky diode with a breakdown voltage of 2 kV," Appl. Phys. Exp., vol. 10, No. 6, May 2017, pp. 061003(1)-061003(3).

Hong et al., "Low-resistance ohmic contacts for high-power GaN field-effect transistors obtained by selective area growth using plasma-assisted molecular beam epitaxy," Appl. Phys. Lett., vol. 89, No. 4, Jul. 2006, pp. 042101(1)-042101(3).

Hong et al., "Selective-area growth and fabrication of recessed-gate GaN MESFET using plasma-assisted molecular beam epitaxy," Phys. Stat. Sol. A, vol. 203, No. 7, May 2006, pp. 1872-1875.

Kelly et al., "Development of GaN vertical high-power devices enabled by plasma-assisted molecular beam epitaxy," in Dig. CS MANTECH, Minneapolis, MN, USA, 2019, pp. 345-348.

Kimoto et al., "Fundamentals of Silicon Carbide Technology: Growth, Characterization, Devices, and Applications," Singapore: John Wiley & Sons, 2014, p. 283.

Koehler et al., "Vertical GaN junction barrier Schottky diodes," ECS J. Solid State Sci. Technol., vol. 6, No. 1, Dec. 2016, pp. Q10-Q12.

Li et al., "Design and realization of GaN trench junction-barrier-Schottky-diodes," IEEE Trans. Electron Devices, vol. 64, No. 4, Apr. 2017, pp. 1635-1641.

Morisette et al., "Static and dynamic characterization of large-area high-current-density SiC Schottky diodes," IEEE Trans. Electron Devices, vol. 48, No. 2, Feb. 2001, pp. 349-352.

Niwa et al., "Ultrahigh-voltage SiC MPS diodes with hybrid unipolar/bipolar operation," IEEE Trans. Electron Devices, vol. 64, No. 3, Mar. 2017, pp. 874-881.

Padovani et al., "Field and thermionic-field emission in Schottky barriers," Solid-State Electron., vol. 9, No. 7, Jul. 1966, pp. 695-707.

Pang et al., "Breakdown voltage enhancement of AlGaN/GaN high-electron-mobility transistors via selective-area growth for ohmic contacts over ion implantation," J. Electron. Mater., vol. 39, No. 5, May 2010, pp. 499-503.

Pierret, "Modular Series on Solid State Devices," Semiconductor Device Fundamentals. vol. VI, Second Edition, 1996, New Jersey, NJ, USA: Prentice Hall, p. 481.

Pong et al., "Structural defects and microstrain in GaN induced by Mg ion implantation," J. Appl. Phys., vol. 83, No. 11, Feb. 1998, pp. 5992-5996.

Sarker et al., "GaN high performance low-leakage p-islet MPS diodes enabled by PAMBE-based selective area growth," in Dig. CS MANTECH, Minneapolis, MN, USA, 2019, pp. 321-324.

Seo et al., "Formation of low resistance ohmic contact by damage-proof selective-area growth of single-crystal $n^+$-GaN using plasma-assisted molecular beam epitaxy," J. Electron. Mater., vol. 37, No. 5, May 2008, pp. 635-640.

Seo et al., "Ti-based non-alloyed Ohmic contacts for $Al_{0.5}Ga_{0.85}N$/GaN high electron mobility transistors using regrown $n^+$-GaN by plasma assisted molecular beam epitaxy," Appl. Phys. Lett., vol. 93, No. 10, Aug. 2008, pp. 102102(1)-102102(3).

Stocker et al., "Crystallographic wet chemical etching of GaN," Appl. Phys. Lett., vol. 73, No. 18, Dec. 1998, pp. 2654-2656.

Suda et al., "Nearly ideal current-voltage characteristics of Schottky barrier diodes formed on hydride-vapor-phase-epitaxy-grown GaN freestanding substrates," Appl. Phys. Exp., vol. 3, No. 10, Oct. 2010, pp. 101003(1)-101003(3).

Zhang et al., "Origin and control of OFF-state leakage current in GaN-on-Si vertical diodes," IEEE Trans. Electron Devices, vol. 62, No. 7, May 2015, pp. 2155-2161.

Zhang et al., "Trench formation and corner rounding in vertical GaN power devices," Appl. Phys. Lett., vol. 110, No. 19, May 2017, pp. 193506(1)-193506(4).

Zhang et al., "Vertical GaN junction barrier Schottky rectifiers by selective ion implantation," IEEE Electron Device Lett., vol. 38, No. 8, Jun. 2017, pp. 1097-1100.

Zheng et al., "Nonalloyed ohmic contact of AlGaN/GaN HEMTs by selective area growth of single-crystal $n^+$-GaN using plasma assisted molecular beam epitaxy," Phys. Stat. Sol. A, vol. 208, No. 4, Apr. 2011, pp. 951-954.

International Search Report and Written Opinion from corresponding International Application No. PCT/US2021/043989 dated Jun. 1, 2022, 10 pp.

Zhang et al., "Device Design Assessment of GaN Merged P-i-N Schottky Diodes," *Electronics*, 8, 1550 (2019) pp. 1-11.

* cited by examiner

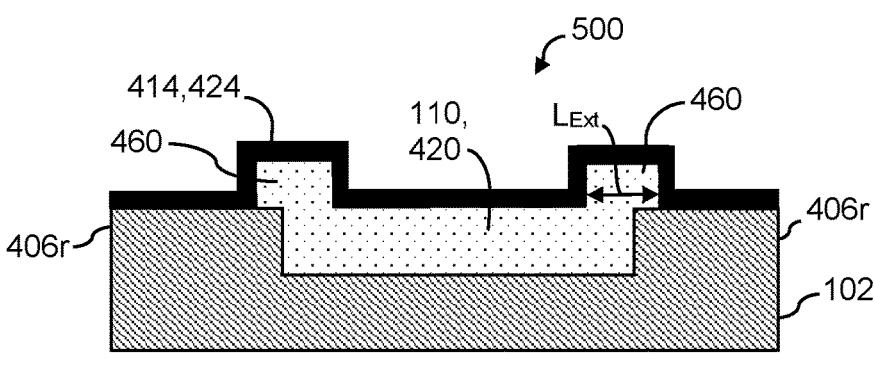
FIG. 8I
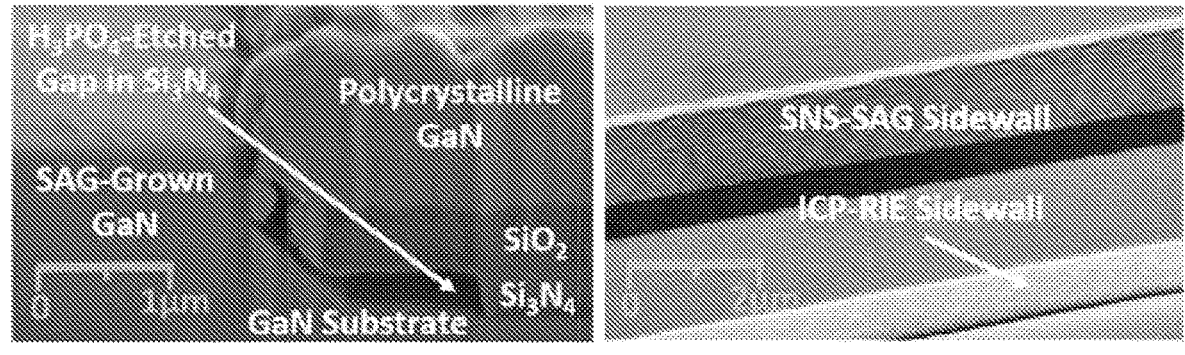
FIG. 9A                    FIG. 9B
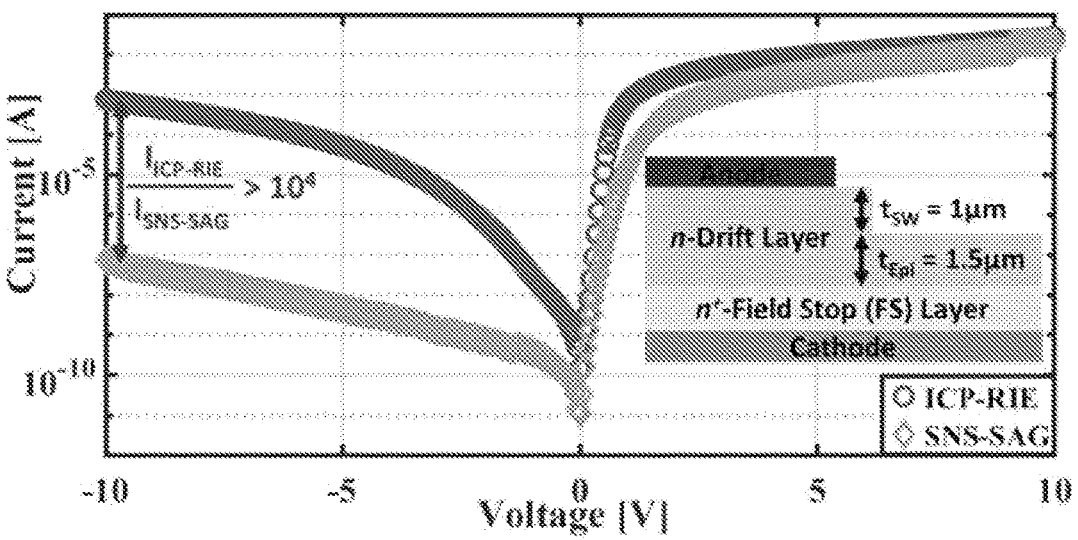
FIG. 10

LOW-LEAKAGE SCHOTTKY DIODES AND METHOD OF MAKING A POWER SEMICONDUCTOR DEVICE

RELATED APPLICATION

The present patent document is the U.S. national stage of International Application No. PCT/US2021/043989, which was filed on Jul. 30, 2021, and claims the benefit of priority under 35 U.S.C. 119(e) to U.S. Provisional Patent Application No. 63/059,481, which was filed on Jul. 31, 2020. Both of the preceding patent applications are hereby incorporated by reference in their entirety.

STATEMENT OF FEDERALLY FUNDED RESEARCH OR DEVELOPMENT

This invention was made with government support under contract number N00014-17-1-2681 awarded by the Office of Naval Research. The government has certain rights in the invention.

TECHNICAL FIELD

The present disclosure is related generally to power semiconductor devices and more particularly to low-leakage mixed conduction diodes.

BACKGROUND

High power electronics are an integral part of modern technology in power conversion, storage, and transfer. Increasing the efficiency of these systems can save a great deal of money and natural resources related to power generation and infrastructure. To do this, it is necessary to use materials capable of handling higher voltages. Gallium nitride (GaN) is one such material. In comparison to silicon (Si) and silicon carbide (SiC), which are considered the other mature power electronics materials, GaN has a much higher figure of merit, owing to its high critical electric field. A high critical electric field translates to being able to operate in the "off" state at high voltages without breakdown. This on/off switching efficiency is important to power electronics.

The on/off ratio, which is the ratio of current for the diode from when it is on to when it is off, is a very useful metric to characterize switching efficiency. Since diodes turn on with positive bias (positive voltage at the anode) and off with negative bias, this ratio is often defined at symmetric voltages, e.g., $r_{on/off} = I(V=10V)/I(V=-10V)$. This ratio is preferably as high as possible, ideally $\sim 10^{10}$-$10^{20}$. However, in real devices, lowering of current in the forward bias (high forward resistance) and heightening of current in the reverse bias (leakage current) can reduce this significantly. For GaN, a significant challenge is the reduction of leakage current. Leakage current occurs through current pathways parallel to the device that allow charge carriers to bypass the blocking action of the switch. This is analogous to a leaky faucet; when the valve is closed, water can only come out through small holes or imperfections in the seal. This leakage current may cause not only a loss of power but also a reduction in breakdown voltage and device lifetime, since in the off-state the device may need to operate at high voltages. If too much current passes at high voltages, over-heating and premature failure may occur. Therefore, identifying and removing these leakage pathways may be critical to improving device performance.

A primary source of leakage pathways comes from the interfaces and material defects caused by device processing. The two primary methods of selective vertical epitaxial processing of GaN are dry etching via inductively coupled plasma-reactive ion etching (ICP-RIE) and ion implantation. ICP-RIE involves creating a highly reactive plasma that can be used to bombard a sample to selectively remove material. This may cause crystalline defects to form along the sidewalls and the bottom surfaces of the etched area in the form of point defects, such as vacancies, dislocations or local amorphization. Ion implantation is another method that also bombards the sample with high energy ions and consequently may also cause crystalline defects. This occurs on a larger scale since the ions must have enough energy to travel significant distances into the sample. In this case, material is not removed, and the defects occur in the bulk of the sample and must be annealed out. Both methods tend to result in damage to the sample that promotes leakage.

BRIEF SUMMARY

According to a first embodiment, a merged p-i-n junction barrier controlled Schottky diode includes: a cathode layer; a field stop layer on the cathode layer, the field stop layer comprising heavily doped n-type GaN; a drift layer on the field stop layer, the drift layer comprising lightly doped or unintentionally doped n-type GaN; a p-islet on the drift layer, the p-islet comprising: a p-base layer comprising lightly doped p-type GaN; and a $p^+$ layer on the p-base layer, the $p^+$ layer comprising heavily doped p-type GaN; and buried p-bases embedded in the drift layer and separated from each other in a radial direction by drift regions comprising the lightly doped n-type GaN, the buried p-bases comprising lightly doped p-type GaN and optionally being positioned radially outward from the p-islet; and an anode layer having a first portion overlying the p-islet and a second portion overlying the buried p-bases and the drift regions, wherein a last of the buried p-bases in the radial direction is a p-termination section, and wherein the p-termination section extends farther in the radial direction than the second portion, thereby ensuring termination of the anode layer on p-type GaN, and wherein a sidewall of each of the buried p-bases and the p-islet is substantially smooth and/or defect-free.

According to a second embodiment, a merged p-i-n junction barrier controlled Schottky diode comprises: a cathode layer; a field stop layer on the cathode layer, the field stop layer comprising heavily doped n-type GaN; a drift layer on the field stop layer, the drift layer comprising lightly doped or unintentionally doped n-type GaN; a buried p-region embedded in the drift layer, the buried p-region comprising: a p-base layer comprising lightly doped p-type GaN; and a $p^+$ layer on the p-base layer, the $p^+$ layer comprising heavily doped p-type GaN; and buried p-bases embedded in the drift layer and separated from each other in a radial direction by drift regions comprising the lightly doped n-type GaN, the buried p-bases comprising lightly doped p-type GaN and optionally positioned radially outward from the buried p-region; and an anode layer overlying the buried p-region, the buried p-bases and the drift regions, wherein a last of the buried p-bases in the radial direction is a p-termination section, and wherein the p-termination section extends farther in the radial direction than the anode layer, thereby ensuring termination of the anode layer on p-type GaN, and wherein a sidewall of each of the buried p-bases and the buried p-region is substantially smooth and/or defect-free.

A method of fabricating a power semiconductor device includes forming a bilayer mask on a semiconductor substrate, where the bilayer mask comprises a first dielectric layer on the semiconductor substrate and a second dielectric layer on the first dielectric layer. The first and second dielectric layers are through-etched to define an exposed portion of the semiconductor substrate. The first dielectric layer is selectively etched to form an undercut region of the bilayer mask. A crystalline semiconductor material is epitaxially grown on the exposed portion of the semiconductor substrate, and a polycrystalline semiconductor material is deposited on the second dielectric layer of the bilayer mask. After the epitaxial growth, the bilayer mask and the polycrystalline semiconductor material are removed from the semiconductor substrate, leaving behind a mesa comprising the crystalline semiconductor material on the semiconductor substrate. Advantageously, a sidewall of the mesa is substantially smooth and/or defect-free.

BRIEF DESCRIPTION OF THE DRAWINGS

FIGS. 8A-8I show an exemplary SNS-SAG process flow to form a buried layer (e.g., a buried p-base) having a SAG compatible structure.

FIG. 9A shows a post-growth cross-sectional scanning electron microscopy (SEM) image of an undercut bilayer mask ($SiO_2/Si_3N_4$) on a GaN substrate.

FIG. 9B shows a SEM image of side-by-side mesas formed by SNS-SAG and ICP-RIE.

FIG. 10 shows I-V characteristics of SNS-SAG and ICP-RIE derived Schottky barrier diode (SBD) structures.

DETAILED DESCRIPTION

A selective area processing methodology for power electronic devices that avoids the damage (e.g., roughness) and defects inherent to dry etching and ion implantation has been developed. The methodology, referred to as silicon nitride shadowed selective-area growth (SNS-SAG), can produce smooth semiconductor interfaces and sidewalls and low leakage current, thereby enabling high-performance vertical GaN power electronic devices with reliable device operation. FIGS. 1A-1G and 8A-8I schematically show exemplary process flows for SNS-SAG.

Figure 2:
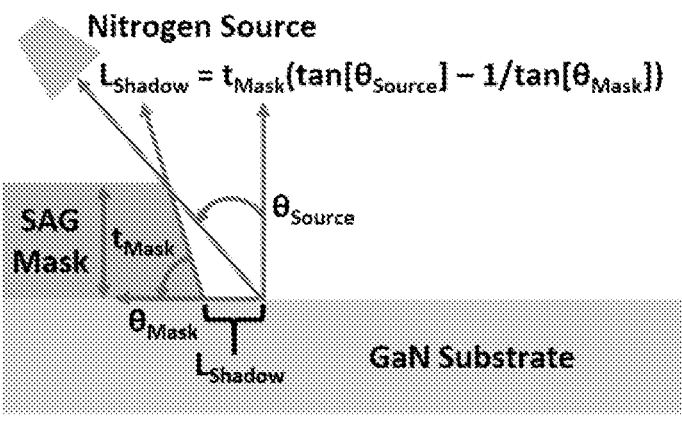
FIG. 2 illustrates the shadowing effect in plasma-assisted molecular beam epitaxy.

Before the SNS-SAG method is described in detail, the challenges and motivation are further explained. As indicated above, existing selective area processing methods introduce damage and defects to sidewalls and/or are unable to produce thicker layers, such as edge termination structures, without noticeable sidewall damage or surface roughness. For example, a previously developed selected area growth method cannot be directly extended to thicker layers due to the polycrystalline gallium nitride (poly-GaN) that grows on the mask sidewalls and inevitably intersects with epitaxial growth regions on the substrate, introducing roughness and/or defects. The inventors have recognized that a solution is to engineer the mask sidewalls to be out of line-of-sight of the plasma source, such that they are "shadowed," or starved of flux; consequently, there is no growth of poly-GaN as well as limited epitaxial growth in the intersecting region $L_{Shadow}$, as illustrated schematically in FIG. 2. The maximum amount of shadowing that may be achieved by most methods is from a perfectly vertical mask sidewall. However, in a real growth scenario, the substrate may be rotated for the sake of uniformity and, as such, even a nearly 90° sidewall can result in noticeable roughness. It is recognized in view of these challenges that total shadowing may be achieved by forming an undercut in the mask.

Figure 1A:
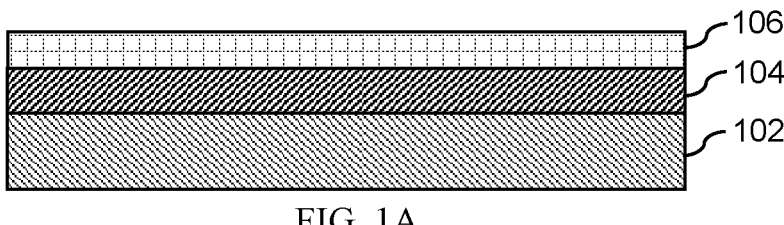
FIGS. 1A-1G show an exemplary process flow for silicon nitride shadowed selective-area growth (SNS-SAG) to form mesas and buried layers having sidewalls with exceptionally low roughness and defect density.
Figure 1B:
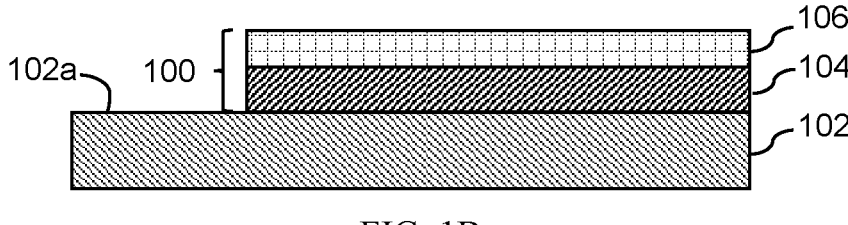

Referring now to FIGS. 1A and 1B, the SNS-SAG method includes forming a bilayer mask 100 that is ultimately undercut to enable the requisite shadowing of the semiconductor substrate 102. The bilayer mask 100 includes a first dielectric layer 104 on the semiconductor substrate 102 and a second dielectric layer 106 on the first dielectric layer 104. The second dielectric layer 106, which may comprise silicon oxide (e.g., $SiO_2$), functions as a structural layer and may thus require high strength. The first dielectric layer 104, which may comprise silicon nitride (e.g., $Si_3N_4$ or $SiN_x$, where $0.5 \leq x \leq 1.5$), acts as a stress relief interlayer with a coefficient of thermal expansion between that of the second dielectric layer 106 and the semiconductor substrate 102, which may comprise GaN. In some examples, the semiconductor substrate 102 may comprise an n-type dopant (e.g., Si or Ge) and/or may be unintentionally doped (UID) n-type. Alternatively, the semiconductor substrate 102 may comprise a p-type dopant, such as Mg or Mn. To form the bilayer mask 100, the first and second dielectric layers 104, 106 may be through-etched to define a window to the semiconductor substrate 102, thereby forming an exposed portion 102a of the substrate 102 where epitaxial growth may occur. The through-etching may comprise inductively coupled plasma reactive-ion etching (ICP-RIE) using, for example, ICP-RIE gases comprising $CHF_3$ and $O_2$ to ensure a vertical etch profile and/or a through-etch mask comprising Ni to ensure high selectivity.

Figure 1C:
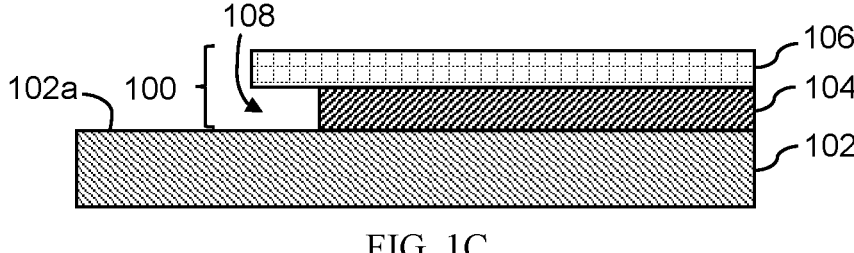

Referring now to FIG. 1C, the first dielectric layer 104 is selectively etched to form an undercut region 108 with a depth configured to be out of line-of-sight of a plasma source; thus, the undercut region 108 may be shadowed during a subsequent plasma-assisted epitaxial growth process. The selective etching may entail exposing the bilayer mask 100 to a wet etchant, such as hot phosphoric acid (e.g., phosphoric acid heated to a temperature in a range from about 150° C. to about 180° C.), which preferentially etches the first dielectric layer 104.

Figure 1D:
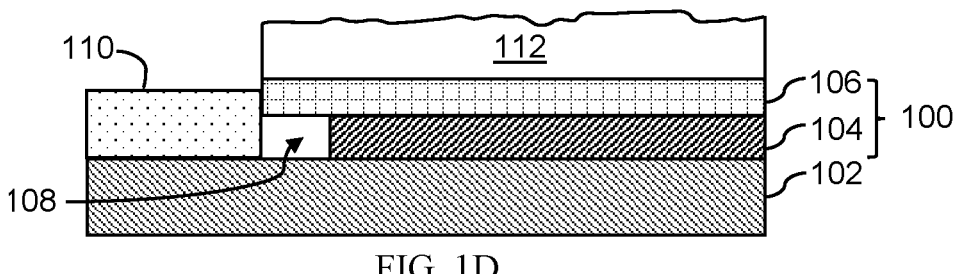

As illustrated in FIG. 1D, a crystalline semiconductor material 110 is then epitaxially grown, e.g., by plasma-assisted molecular beam epitaxy (PAMBE) or another suitable growth technique, on the exposed portion 102a of the semiconductor substrate 102, and a polycrystalline semiconductor material 112 is deposited on the second dielectric layer 106 of the bilayer mask 100. As explained above, the undercut region 108 created by selective etching of the bilayer mask 100 is essentially starved of flux due to its out of line-of-sight positioning with respect to the plasma source, and thus there is no deposition of the polycrystalline semiconductor material 112 as well as limited to no epitaxial growth of the crystalline semiconductor material 110 in this region 108. The plasma source employed for PAMBE may be a radiofrequency (RF) nitrogen plasma source. The crystalline semiconductor material 110 may comprise gallium nitride (GaN), which may be p-doped (i.e., include a p-type dopant) or n-doped (i.e., include an n-type dopant). Exemplary p-type dopants may include Mg or Mn, and exemplary n-type dopants may include Si or Ge.

Figure 1E:
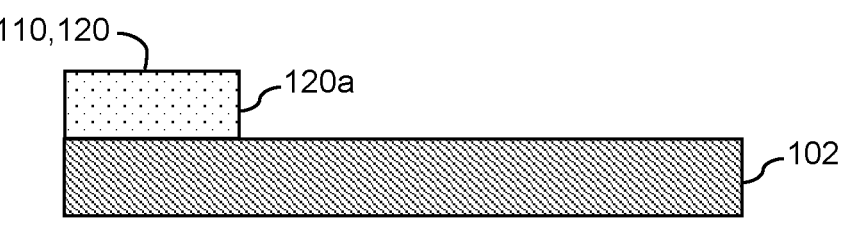

After epitaxial growth of the crystalline semiconductor material 110, the bilayer mask 100 and the polycrystalline semiconductor material 112 deposited on the bilayer mask 100 are removed from the semiconductor substrate 102. Left behind on the substrate 102 is a mesa (or "regrown area" or "regrowth") 120 comprising the crystalline semiconductor material 110, as illustrated in FIG. 1E. In contrast to previous methods, the mesa 120 is formed without etching and without ion implantation.

Figure 1F:
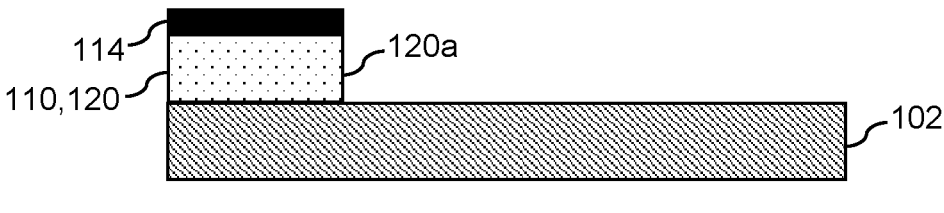
Figure 1G:
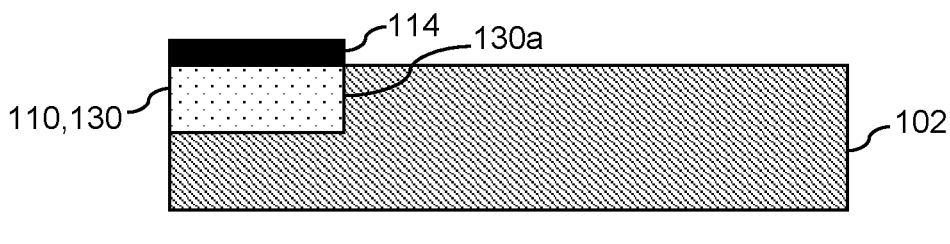

The method may further include, after removing the bilayer mask 100 and the polycrystalline semiconductor material 112, further processing the semiconductor substrate 102 to form a power semiconductor device. If the mesa 120 is to serve as an islet structure (e.g., a p-islet, as described below) in the power semiconductor device, the further processing may include deposition and patterning of an anode layer 114 onto the mesa 120, as illustrated in FIG. 1F. In another example, as shown in FIG. 1G, the further processing may include semiconductor regrowth to create a buried layer 130 comprising the crystalline semiconductor material 110, followed by deposition and patterning of an anode layer 114. This additional processing may entail repetition of the SNS-SAG process, as described in more detail below in reference to FIGS. 8A-8I. Also, as can be understood in reference to these figures, FIG. 1G is an idealized schematic that does not show the SAG compatible structure of the buried layer 130. Although just a single mesa (islet structure) 120 and buried layer 130 are illustrated in FIGS. 1F and 1G, it is noted that the bilayer mask 100 may be patterned as desired (e.g., in the processing step shown in FIG. 1B) to allow for fabrication of multiple mesas 120 and/or buried layers 130 on the semiconductor substrate 102.

Due to the presence of the undercut region 108 during regrowth, sidewalls 120a, 130a of the epitaxially grown mesa 120 and/or the buried layer 130 may be substantially smooth and/or defect-free. Extremely low sidewall roughness values, which have not been previously attainable, have been demonstrated using the SMS-SAG method. For example, a sidewall 120a, 130a of the mesa 120 or buried layer 130 may exhibit a root mean squared (RMS) surface roughness less than about 1 nm, such as in a range from about 0.1 nm to about 1 nm, or from about 0.5 nm to about 1 nm. Preferably, the RMS surface roughness of the sidewall 120a, 130a is about 0.5 nm or less, such as in a range from about 0.1 nm to about 0.5 nm. Given the damage-free processing, the sidewall 120a, 130a may have a defect density comparable to that achieved with planar epitaxy (e.g., $<10^6$ $cm^{-2}$ or $<10^5$ $cm^{-2}$). The exceptionally smooth and substantially defect-free sidewalls enabled by SNS-SAG allow for significantly improved device performance. Experimental data described below reveal that Schottky barrier diode (SBD) structures fabricated using SNS-SAG instead of ICP-RIE may exhibit an improvement (decrease) in leakage current by more than four orders of magnitude.

Many structures, including edge termination, require thicknesses in excess of 200 nm, and such structures could not be fabricated using previous methods without noticeable sidewall roughness. The mesas 120 and buried layers 130 formed using SNS-SAG—and having the exceptionally low roughness values described above—may have large thicknesses (or depths), e.g., thicknesses or depths greater than 200 nm. For example, the thickness or depth may be at least about 300 nm, at least about 500 nm, or at least about 1 micron, and/or as large as about 2 microns, or as large as about 3 microns. The impact of thickness or depth on leakage current is discussed below in device examples. Typically, the bilayer mask 100 is formed to have a thickness greater than or equal to the thickness of the mesa 120, and/or the first dielectric layer 104 may have a thickness of at least about 30% of the mesa thickness.

Exemplary power semiconductor devices 150 that may be prepared using the SNS-SAG method include any of the following devices: insulated-gate bipolar transistor (IGBT), power bipolar junction transistor (BJT), metal oxide semiconductor field effect transistor (MOSFET), depletion MOSFET (D-MOSFET), U-/V-MOSFET, shielded-channel MOSFET (SC-MOSFET), charge-coupled MOSFET (CC-MOSFET), super-junction MOSFET (SJ-MOSFET), Schottky barrier diode (SBD), p-i-n diode (PND), merged p-i-n Schottky diode (MPS) diode, merged p-i-n junction barrier controlled Schottky (MP J) diode, junction barrier Schottky (JBS) diode, trench MOS barrier controlled Schottky (TMBS) diode, and/or another power diode or MOSFET. The method may be particularly suited to fabricating a power semiconductor device comprising a MPS diode or MPJ diode, as described in detail below.

Figures 3A, 3B:
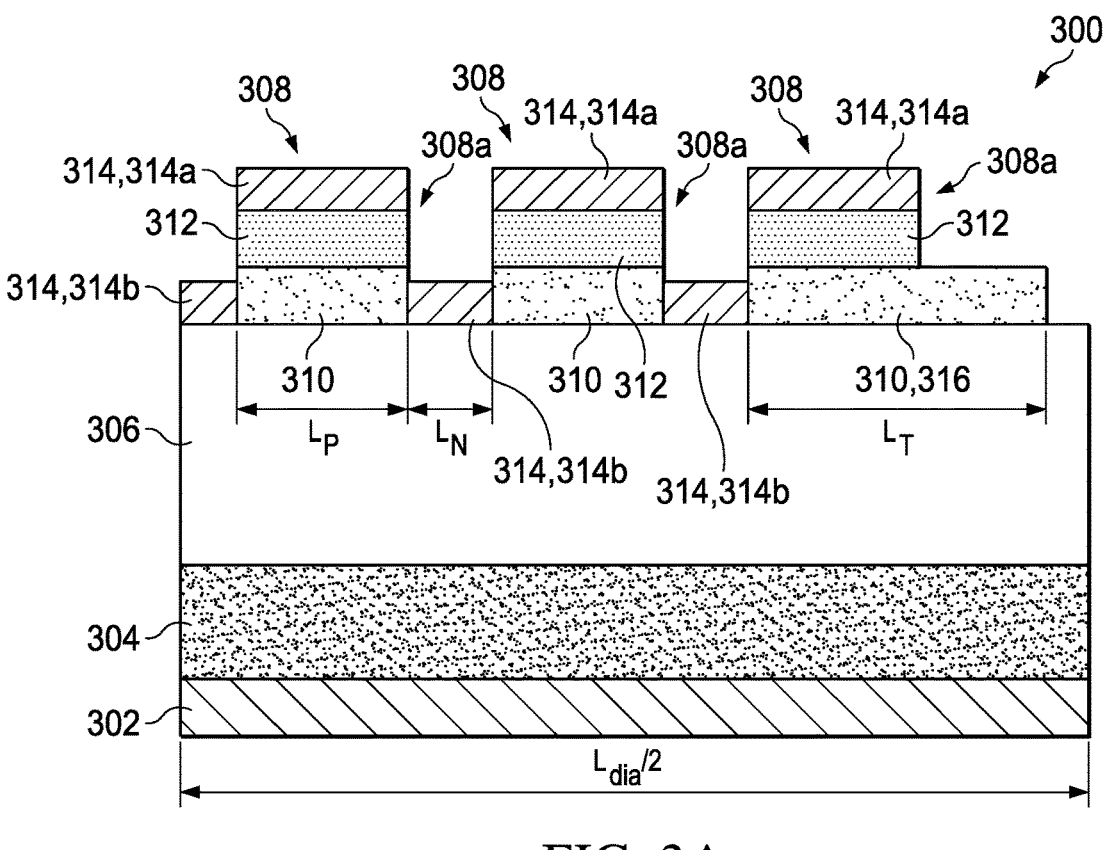
FIG. 3A is a schematic of an exemplary half-structure of a p-islet merged p-i-n Schottky (PI-MPS) diode.
FIG. 3B is a schematic of an exemplary half-structure of a p-base merged p-i-n Schottky (BP-MPS) diode.

Two exemplary designs for merged p-i-n Schottky (MPS) diodes are illustrated in FIGS. 3A and 3B and described below. When processed using the SNS-SAG method, the MPS diodes exhibit a reduced leakage current compared to devices processed using conventional methods (e.g., epitaxial growth followed by etching or ion implantation followed by etching) that are associated with sidewall damage and defects.

Referring first to FIG. 3A, which shows a p-islet MPS (PI-MPS) diode half-structure, the PI-MPS diode 300 includes a cathode layer 302, a field stop layer 304 comprising heavily doped n-type GaN on the cathode layer 302, and a drift layer 306 comprising lightly doped or unintentionally doped n-type GaN on the field stop layer 304. The PI-MPS diode 300 further includes p-islets 308 on the drift layer 306 separated from each other in a radial direction, where each of the p-islets 308 comprises a p-base layer 310 comprising lightly doped p-type GaN, and a p$^+$ layer 312 comprising heavily doped p-type GaN on the p-base layer 310. The schematic of FIG. 3A shows three p-islets 308 on the drift layer 306, but the design is not limited to three; the PI-MPS diode 300 may have any suitable number of p-islets 308, such as at least two and up to ten or twenty. The PI-MPS diode 300 further includes an anode layer 314 including anode regions 314b on the drift layer 306 between the p-islets 308, and anode portions 314a on the p-islets 308. The p-base layer 310 of a last of the p-islets 308 in the radial direction is a p-termination layer 316, which extends farther in the radial direction than the overlying anode portion 314a, thereby ensuring termination of the anode layer 314 on p-type GaN. Advantageously, due to the SNS-SAG processing described above, sidewall(s) 308a of each of the p-islets 308 are substantially smooth and/or defect-free. For example, sidewalls 308a of the p-islets 308 may exhibit a root mean squared (RMS) surface roughness less than about 1 nm, such as in a range from about 0.1 nm to about 1 nm, or from about 0.5 nm to about 1 nm. Preferably, the RMS surface roughness of the sidewalls 308a is about 0.5 nm or less, such as in a range from about 0.1 nm to about 0.5 nm. Consequently, when operated under a reverse bias of 200 V, the PI-MPS diode 300 may exhibit a leakage current density of about $1 \times 10^{-4}$ A/cm$^2$ or less.

The drift layer 306 typically has a thickness in a range from about 1 micron to about 50 microns. The lightly doped or unintentionally doped n-type GaN of the drift layer 306 may include an n-type dopant at a concentration in a range from about $8 \times 10^{15}$ cm$^{-3}$ to about $2 \times 10^{16}$ cm$^{-3}$, and may optionally further include p-type compensation. The n-type dopant may comprise Si or Ge. Typically, the field stop layer 304 may have a thickness in a range from about 50 microns to about 400 microns, and/or from about 200 microns to about 400 microns. The heavily doped n-type GaN of the field stop layer 304 may include an n-type dopant at a concentration in range from about $1 \times 10^{18}$ cm$^{-3}$ to about $1 \times 10^{19}$ cm$^{-3}$.

The p$^+$ layer 312 of each of the p-islets 308 may have a thickness in a range from about 1 nm to about 50 nm. The heavily doped p-type GaN of the p$^+$ layer 312 may include a p-type dopant at a concentration in range from about $2 \times 10^{19}$ to about $2 \times 10^{20}$ cm$^{-3}$. The presence of the p$^+$ layer 312 may ensure an ohmic contact. The p-base layer 310 of each of the p-islets 308 may have a thickness of about 300 nm or greater, about 500 nm or greater, or even up to about 1 micron or higher. The lightly doped p-type GaN of the p-base layer 310 may include a p-type dopant at a concentration in a range from about $1 \times 10^{18}$ to about $1 \times 10^{19}$ cm$^{-3}$. The p-type dopant may comprise Mg or Mn.

Each of the p-islets 308 and the anode portions 314a may extend a length L$_p$ in the radial direction in a range from about 1 micron to about 50 microns. The p-termination layer 316 of the last of the p-islets 308 may have a length L$_T$ in the radial direction in a range from about 2 microns to about 4 microns. Each of the anode regions 314b may have a length L$_N$ in the radial direction in a range from about 1 micron to about 3 microns, where the length L$_N$ also represents a separation distance between the p-islets 308. Notably, a smaller value of the length L$_N$ may help reduce leakage substantially, but a value of the length L$_N$ below 1 micron may not be practical in terms of processing.

The anode layer 314 may include a metal or alloy comprising platinum, palladium, and/or nickel. Also or alternatively, the cathode layer 302 may comprise a metal or alloy including aluminum, nickel, gold, and/or titanium. The PI-MPS diode 300 may have a cylindrical shape. Alternatively, the PI-MPS diode 300 may have a square-raster or honeycomb structure, where the radial direction referred to above is a lateral direction.

Referring now to FIG. 3B, which shows a buried p-base MPS (BP-MPS) diode half-structure, the BP-MPS diode 350 includes a cathode layer 302, a field stop layer 304 comprising heavily doped n-type GaN on the cathode layer 302, and a drift layer 306 comprising lightly doped or unintentionally doped n-type GaN on the field stop layer 304. The BP-MPS diode 350 further includes buried p-regions 318 embedded in the drift layer 306 and separated from each other in a radial direction by drift regions 306r comprising the lightly doped n-type GaN. Each of the buried p-regions 318 includes a p-base layer 310 comprising lightly doped p-type GaN and a p$^+$ layer 312 comprising heavily doped p-type GaN on the p-base layer 310. The presence of the p$^+$ layer 312 may ensure an ohmic contact. The buried p-regions 318 may exhibit the SNS-SAG compatible structure 500 illustrated in FIG. 4C (except the p$^+$ layer 312 is not shown in the schematic) and described further in FIGS. 8A-8I. An anode layer 324 overlies the buried p-regions 318 and the drift regions 306r. The p-base layer 310 of a last of the buried p-regions 318 in the radial direction is a p-termination layer 326, which extends farther in the radial direction than the anode layer 324, thereby ensuring termination of the anode layer 324 on p-type GaN. Advantageously, due to the SNS-SAG processing described above, sidewall(s) 318a of each of the buried p-regions 318 are substantially smooth and/or defect-free. For example, sidewalls 318a of the buried p-regions 318 may exhibit a root mean squared (RMS) surface roughness less than about 1 nm, such as in a range from about 0.1 nm to about 1 nm, or from about 0.5 nm to about 1 nm. Preferably, the RMS surface roughness of the sidewalls 318a is about 0.5 nm or less, such as in a range from about 0.1 nm to about 0.5 nm. Consequently, when operated under a reverse bias of 200 V, the BP-MPS diode 350 may exhibit a leakage current density of about $1 \times 10^{-4}$ A/cm$^2$ or less.

The drift layer 306 typically has a thickness in a range from about 1 micron to about 50 microns. The lightly doped or unintentionally doped n-type GaN of the drift layer 306 may include an n-type dopant at a concentration in a range from about $8 \times 10^{15}$ cm$^{-3}$ to about $2 \times 10^{16}$ cm$^{-3}$, and may optionally further include p-type compensation. The n-type dopant may comprise Si or Ge. Typically, the field stop layer 304 may have a thickness in a range from about 50 microns to about 400 microns, and/or from about 200 microns to about 400 microns. The heavily doped n-type GaN of the field stop layer 304 may include an n-type dopant at a concentration in range from about $1 \times 10^{18}$ cm$^{-3}$ to about $1 \times 10^{19}$ cm$^{-3}$.

The p$^+$ layer 312 of each of the buried p-regions 318 may have a thickness in a range from about 1 nm to about 50 nm. The heavily doped p-type GaN of the p$^+$ layer 312 may include a p-type dopant at a concentration in range from about $2 \times 10^{19}$ to about $2 \times 10^{20}$ cm$^{-3}$. The p-base layer 310 of each of the buried p-regions 318 may have a thickness (or depth) of about 300 nm or greater, about 500 nm or greater, or even about 1 micron or greater, such as up to 2 microns or up to 3 microns in thickness. The lightly doped p-type GaN of the p-base layer 310 may include a p-type dopant at a concentration in a range from about $1\times10^{18}$ to about $1\times10^{19}$ cm$^{-3}$. The p-type dopant may comprise Mg or Mn.

Each of the buried p-regions 318 may extend a length $L_p$ in the radial direction in a range from about 1 micron to about 50 microns. The p-termination layer 326 of the last of the buried p-regions 318 may have a length $L_T$ in a radial direction in a range from about 2 microns to about 4 microns. The p-termination layer 326 may wrap around a sidewall of the overlying p$^+$ layer 312, as shown in FIG. 3B. Each of the drift regions 306$r$ may have a length $L_N$ in a radial direction in a range from about 1 micron to about 3 microns, where the length $L_N$ also represents a separation distance between the buried p-regions 318.

The anode layer 324 may comprise a metal or alloy including platinum, palladium, and/or nickel. Also or alternatively, the cathode layer 302 may comprise a metal or alloy including aluminum, nickel, gold, and/or titanium. The BP-MPS diode 350 may have a cylindrical shape. Alternatively, the BP-MPS diode 350 may have a square-raster or honeycomb structure, wherein the radial direction referred to above is a lateral direction.

Figure 4A:
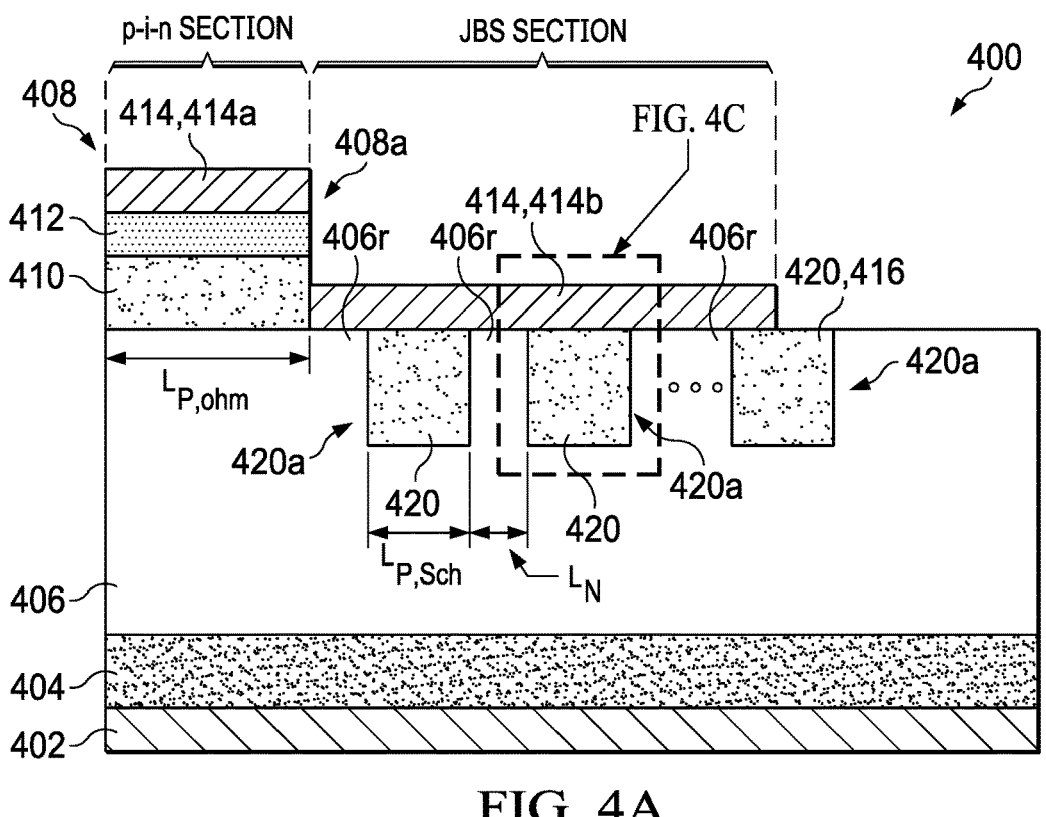
FIG. 4A is a schematic of an exemplary half-structure of a p-islet merged p-i-n junction barrier controlled Schottky (PI-MPJ) diode.
Figure 4B:
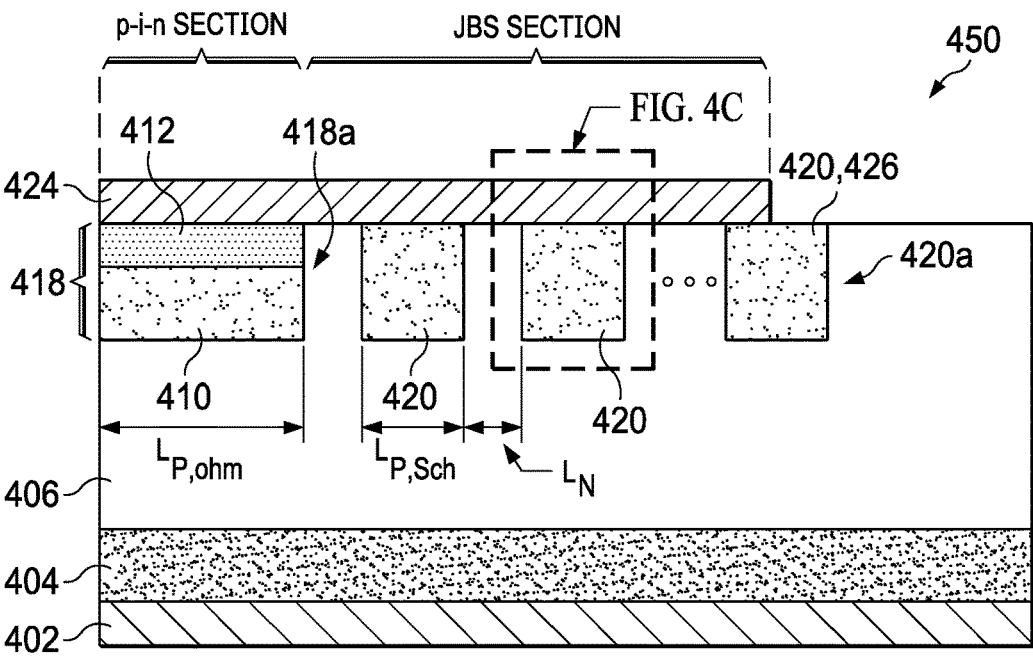
FIG. 4B is a schematic of an exemplary half-structure of a buried p-base merged p-i-n junction barrier controlled Schottky (BP-MPJ) diode.
Figure 4C:
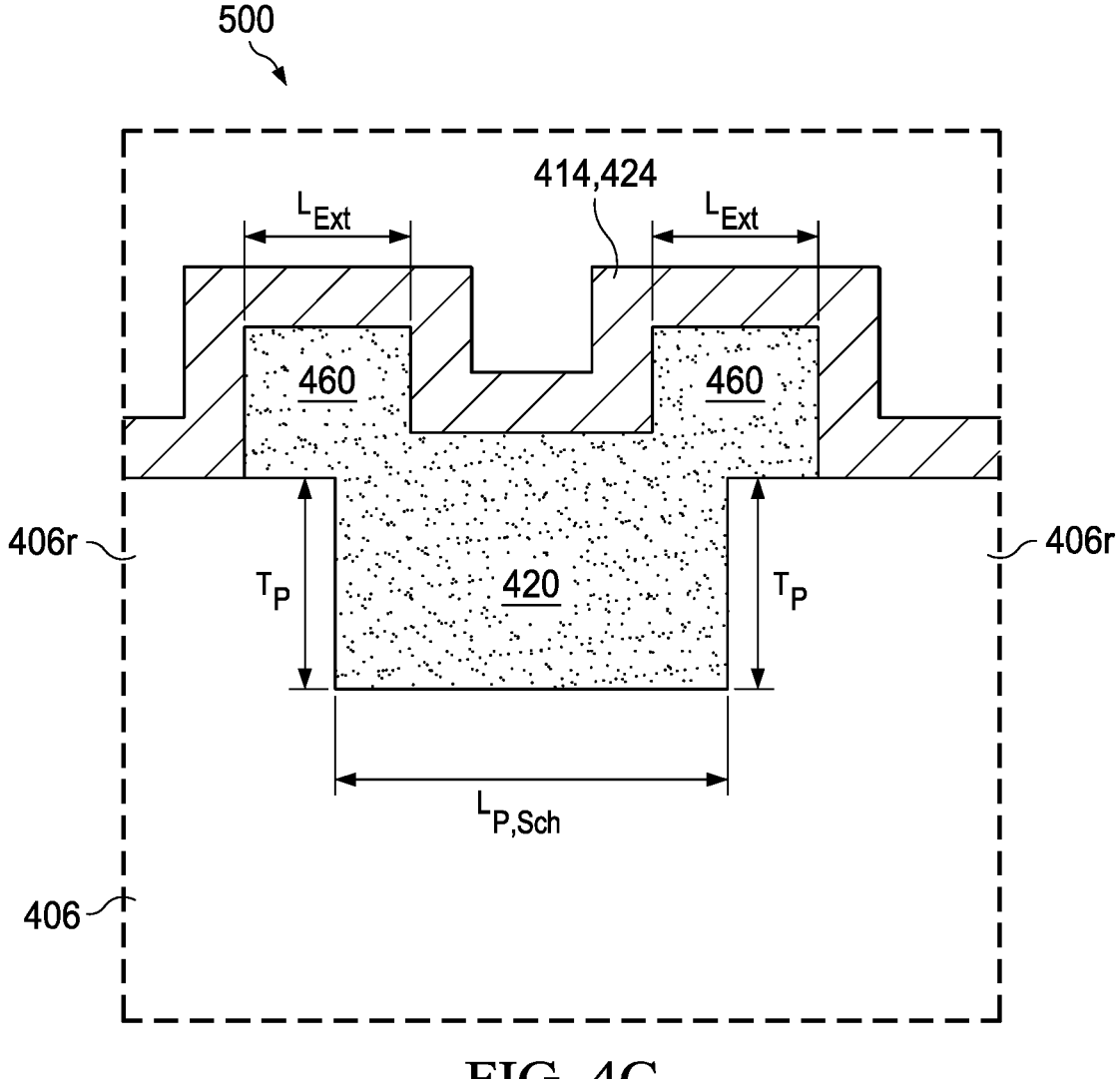
FIG. 4C is a schematic showing including a SAG compatible structure of the MPJ diodes.

Two exemplary designs for merged p-i-n junction barrier controlled Schottky (MPJ) diodes are illustrated in FIGS. 4A and 4B. These devices were developed in an effort to improve upon the MPS diodes 300,350 described above by further reducing leakage current. FIG. 4C provides a close-up schematic of part of the MPJ diodes 400,450 and shows what may be referred to as a SAG compatible structure 500. Fabrication of this SAG compatible structure 500 is discussed below in regard to FIGS. 8A-8I.

Referring first to FIG. 4A, which shows a p-islet MPJ (PI-MPJ) diode half-structure, the PI-MP J diode 400 includes a cathode layer 402, a field stop layer 404 comprising heavily doped n-type GaN on the cathode layer 402, and a drift layer 406 comprising lightly doped or unintentionally doped n-type GaN on the field stop layer 404. The PI-MPJ diode 400 further includes a p-islet 408 on the drift layer 406, where the p-islet 408 includes a p-base layer 410 comprising lightly doped p-type GaN and a p$^+$ layer 412 comprising heavily doped p-type GaN on the p-base layer 410. The presence of the p$^+$ layer 412 may ensure an ohmic contact. The PI-MPJ diode further includes buried p-bases 420 embedded in the drift layer 406 and separated from each other in a radial direction by drift regions 406$r$ comprising the lightly doped n-type GaN. The buried p-bases 420 comprise lightly doped p-type GaN and are positioned radially outward from the p-islet 408. The PI-MPJ diode 400 further comprises an anode layer 414 having a first portion 414$a$ overlying the p-islet 408 and a second portion 414$b$ overlying the buried p-bases 420 and the drift regions 406$r$. A last of the buried p-bases 420 in the radial direction is a p-termination section 416, which extends farther in the radial direction than the second portion 414$b$, thereby ensuring termination of the anode layer 414 on p-type GaN. Advantageously, due to the SNS-SAG processing described above, sidewall(s) of each of the buried p-bases 420 and the p-islet 408 are substantially smooth and/or defect-free. For example, sidewalls 408$a$,420$a$ of the p-islet 408 or the buried p-bases 420 may exhibit a root mean squared (RMS) surface roughness less than about 1 nm, such as in a range from about 0.1 nm to about 1 nm, or from about 0.5 nm to about 1 nm. Preferably, the RMS surface roughness of the sidewalls 408$a$,420$a$ is about 0.5 nm or less, such as in a range from about 0.1 nm to about 0.5 nm. Consequently, when operated under a reverse bias of 200 V, the PI-MPJ diode 400 may exhibit a leakage current density of about $1\times10^{-4}$ A/cm$^2$ or less.

Figures 5A, 5B:
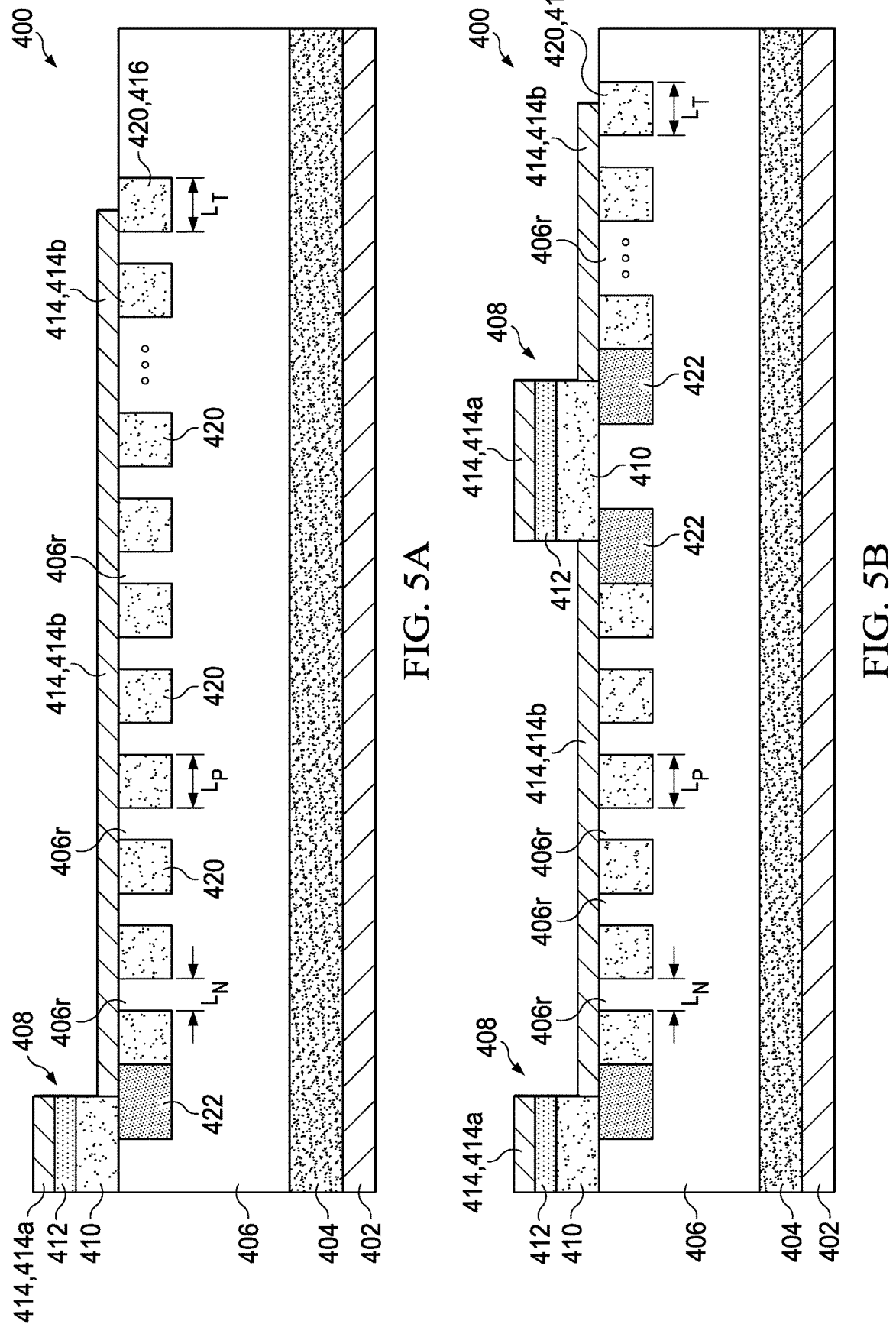
FIGS. 5A-5C show additional exemplary PI-MPJ diode half-structures.
Figures 5C, 7:
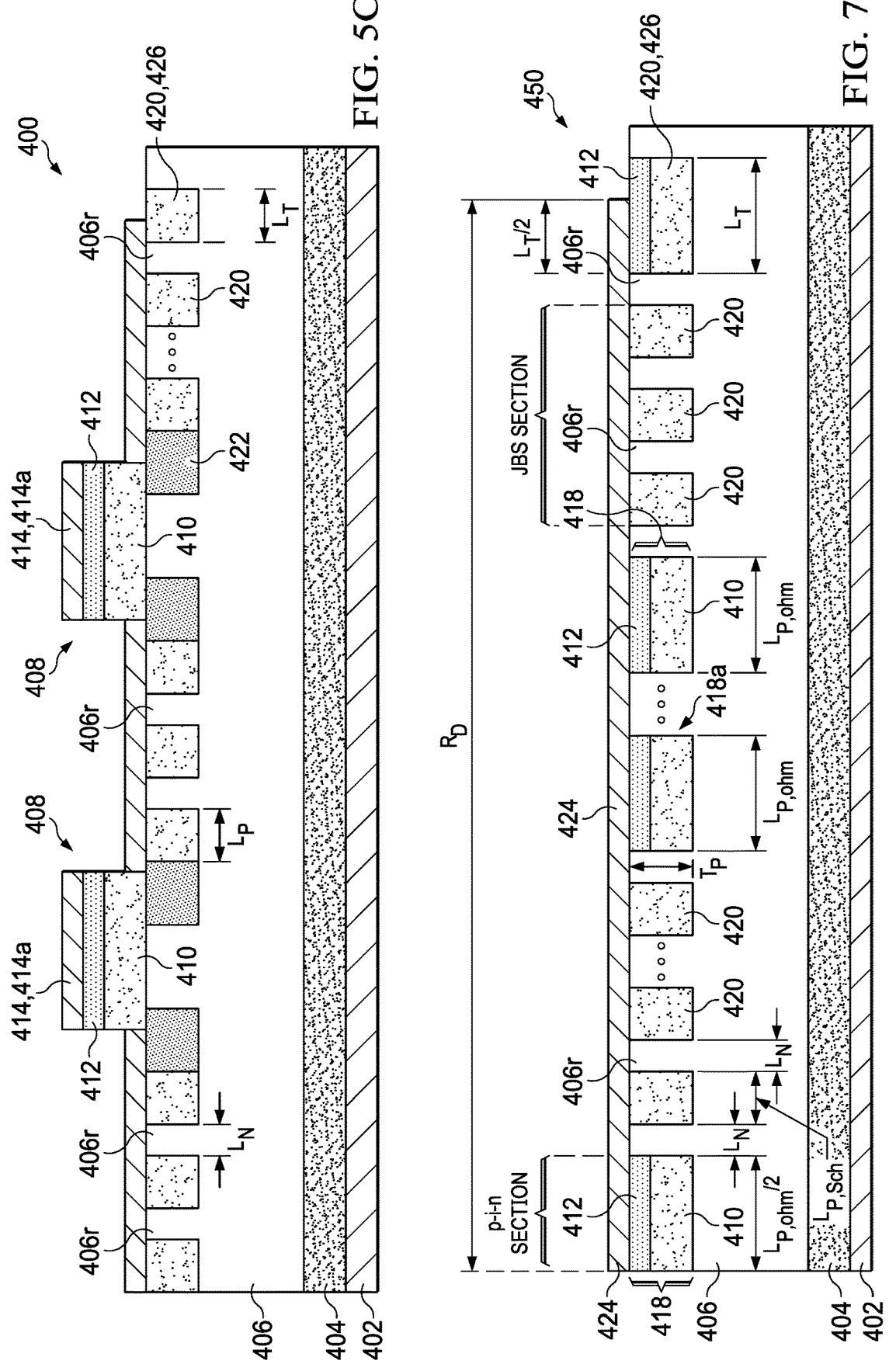
FIG. 7 shows an exemplary BP-MPJ diode half-structure.

The p-islet 408 may be located at a radial center of the diode 400, as shown in FIG. 5A. There may be a plurality of the p-islets 408 radially spaced apart on the drift layer 406, as illustrated in FIGS. 5B and 5C. Regions of the PI-MPJ diode 400 including a p-islet 408 may be referred to as p-i-n sections, while regions including the buried p-bases 420 may be referred to as junction barrier Schottky (JBS) sections of the PI-MPJ diode 400.

The drift layer 406 of the PI-MPJ diode 400 typically has a thickness in a range from about 1 micron to about 50 microns. The lightly doped or unintentionally doped n-type GaN of the drift layer 406 may include an n-type dopant at a concentration in a range from about $8\times10^{15}$ cm$^{-3}$ to about $2\times10^{16}$ cm$^{-3}$, and may optionally further include p-type compensation. The n-type dopant may comprise Si or Ge. The field stop layer 404 may have a thickness in a range from about 50 microns to about 400 microns, and/or from about 200 microns to about 400 microns. The heavily doped n-type GaN of the field stop layer 404 may include an n-type dopant at a concentration in range from about $1\times10^{18}$ cm$^{-3}$ to about $1\times10^{19}$ cm$^{-3}$.

The p$^+$ layer 412 of the p-islet 408 may have a thickness in a range from about 1 nm to about 50 nm. The heavily doped p-type GaN of the p$^+$ layer 412 may include a p-type dopant at a concentration in a range from about $2\times10^{19}$ cm$^{-3}$ to about $2\times10^{20}$ cm$^{-3}$. The p-base layer 410 of the p-islet 408 may have a thickness of about 300 nm or greater, about 500 nm or greater, or even as large as 1 micron or greater. The lightly doped p-type GaN of the p-base layer 310 may include a p-type dopant 310 at a concentration in a range from about $1\times10^{18}$ to about $1\times10^{19}$ cm$^{-3}$. The p-type dopant may comprise Mg or Mn.

The p-islet 408 may extend a length $L_{P,ohm}$ in the radial direction in a range from about 50 microns to about 400 microns. Each of the buried p-bases 420 may extend a length $L_{p,Sch}$ in the radial direction in a range from about 1 micron to about 7 microns. The p-termination section 416 may extend a length $L_T$ in the radial direction in a range from about 2 microns to about 4 microns. Each of the drift regions 406$r$ may have a length $L_N$ in a radial direction in a range from about 1 micron to about 2 microns, where the length $L_N$ also represents a separation distance between the buried p-bases 420.

Referring again to FIGS. 5A-5C, the PI-MP J diode 400 may further include one or more p-link regions 422 embedded in the drift layer 406 and positioned to contact the p-base layer 410 of the p-islet 408 and one of the buried p-bases 420. The p-link region(s) 422 may comprise a p-type dopant at a concentration lower than that of the p-base layer 410 and the buried p-bases 420. Since there may be a number of the p-islets 408 on the drift layer 406, there may be a plurality of the p-link regions 422 embedded in the drift layer 406, where each of the p-link regions 422 contacts one of the p-base layers 410 and one of the buried p-bases 420. Each of the p-link regions 422 may have a length in a range from about 1 micron to about 4 microns and/or an overlap length with the respective p-base layer in a range from about 500 nm to about 1 micron. The one or more p-link regions 422 may be Schottky in nature. In some examples, some or all of the buried p-bases 420 may also be Schottky in nature. Alternatively, some or all of the buried p-bases 420 may be ohmic in nature, enabled by an additional p$^+$ layer 412 atop each such buried p-base 420. The p-bases 420 that are Schottky in nature do not include the p$^+$ layer 412.

Figure 6:
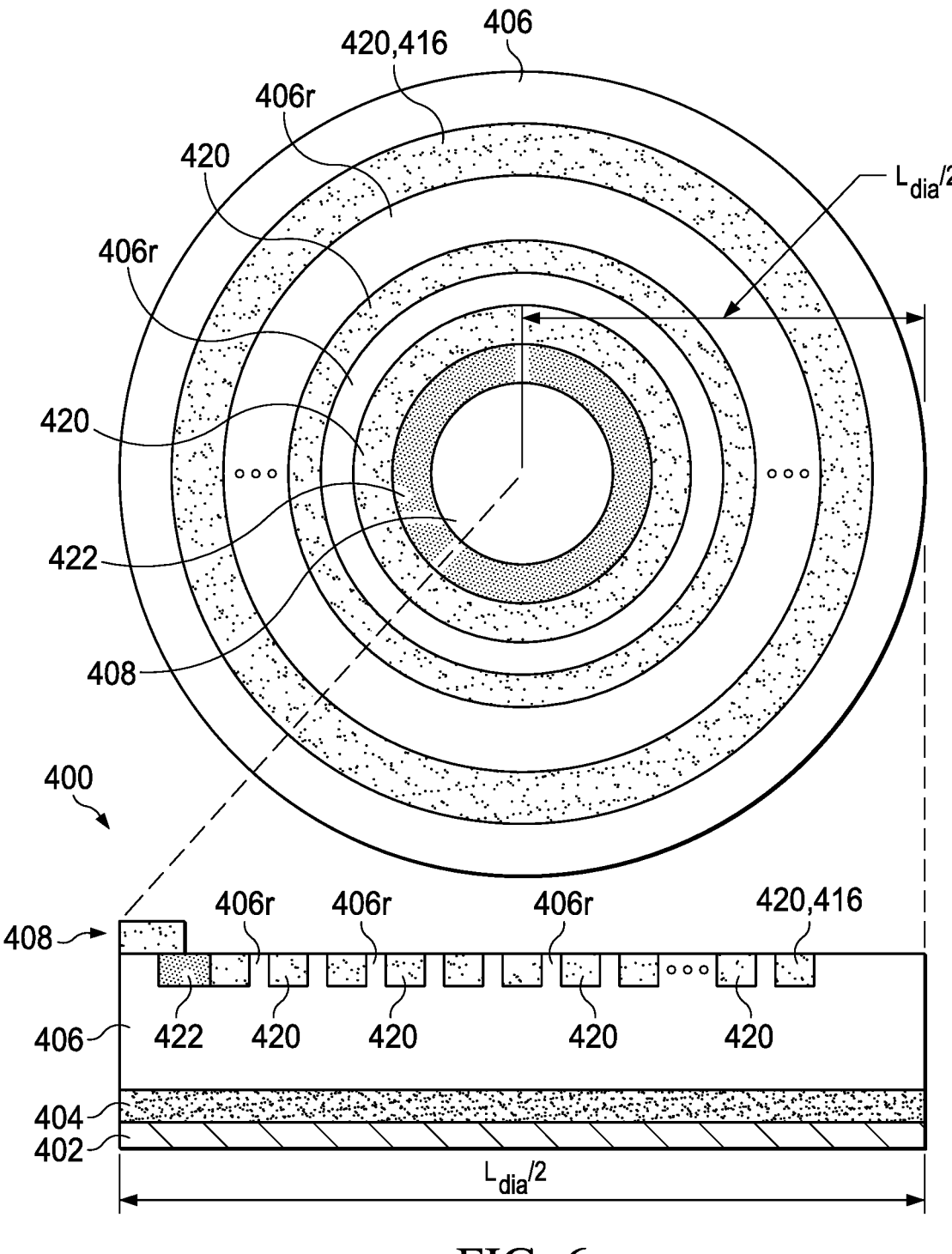
FIG. 6 shows top and cross-sectional views of an exemplary PI-MPJ geometry.

The anode layer 414 may comprise a metal or alloy including platinum, palladium, and/or nickel. Also or alternatively, the cathode layer 402 may comprise a metal or alloy including aluminum, nickel, gold, and/or titanium. The PI-MPJ diode 400 may have a cylindrical shape, as illustrated in FIG. 6, which shows both top and cross-sectional views of an exemplary PI-MPJ geometry, where the p$^+$ layer 412 on the p-islet 408 and the electrode 414 are not explicitly shown. Alternatively, the PI-MPJ diode 400 may have a square-raster or honeycomb structure, wherein the radial direction referred to above is a lateral direction.

Referring now to FIG. 4B, which shows a buried p-base MPJ (BP-MPJ) diode half-structure, the BP-MPJ diode 450 includes a cathode layer 402, a field stop layer 404 comprising heavily doped n-type GaN on the cathode layer 402, and a drift layer 406 comprising lightly doped or unintentionally doped n-type GaN on the field stop layer 404. The BP-MPJ diode 450 further includes a buried p-region 418 embedded in the drift layer 406 that includes a p-base layer 410 comprising lightly doped p-type GaN and a p$^+$ layer 412 comprising heavily doped p-type GaN on the p-base layer 410. The presence of the p$^+$ layer 412 may ensure an ohmic contact. The BP-MPJ diode 450 also includes buried p-bases 420 embedded in the drift layer 406 and separated from each other in a radial direction by drift regions 406r comprising the lightly doped n-type GaN, where the buried p-bases 420 comprise lightly doped p-type GaN and are positioned radially outward from the buried p-region 418. As shown in FIG. 7, the PI-MPJ diode 400 may include a number of the buried p-regions 408 radially spaced apart in the drift layer 406. An anode layer 424 overlies the buried p-regions 418, the buried p-bases 420 and the drift regions 406r. A last of the buried p-bases 420 in the radial direction is a p-termination section 426, which extends farther in the radial direction than anode layer 424, thereby ensuring termination of the anode layer 424 on p-type GaN. Advantageously, due to the SNS-SAG processing described above, sidewall(s) of each of the buried p-bases 420 and the buried p-region(s) 418 are substantially smooth and/or defect-free. For example, sidewalls 418a, 420a of the buried p-regions 418 and buried p-bases 420 may exhibit a root mean squared (RMS) surface roughness less than about 1 nm, such as in a range from about 0.1 nm to about 1 nm, or from about 0.5 nm to about 1 nm. Preferably, the RMS surface roughness of the sidewalls 418a,420 is about 0.5 nm or less, such as in a range from about 0.1 nm to about 0.5 nm. Consequently, when operated under a reverse bias of 200 V, the BP-MPJ diode 450 may exhibit a leakage current density of about $1\times10^{-4}$ A/cm$^2$ or less.

The drift layer 406 typically has a thickness in a range from about 1 micron to about 50 microns. The lightly doped or unintentionally doped n-type GaN of the drift layer 406 may include an n-type dopant at a concentration in a range from about $8\times10^{15}$ cm$^{-3}$ to about $2\times10^{16}$ cm$^{-3}$, and may optionally further include p-type compensation. The n-type dopant may comprise Si or Ge. Typically, the field stop layer 404 may have a thickness in a range from about 50 microns to about 400 microns, and/or from about 200 microns to about 400 microns. The heavily doped n-type GaN of the field stop layer 404 may include an n-type dopant at a concentration in range from about $1\times10^{18}$ cm$^{-3}$ to about $1\times10^{19}$ cm$^{-3}$.

The p$^+$ layer of the buried p-region(s) 418 may have a thickness in a range from about 1 nm to about 50 nm. The heavily doped p-type GaN of the p$^+$ layer 412 may include a p-type dopant at a concentration in range from about $2\times10^{19}$ to about $2\times10^{20}$ cm$^{-3}$. The p-base layer 410 of each of the buried p-regions 418 may have a thickness (or depth) of about 300 nm or greater, about 500 nm or greater, or even about 1 micron or greater, such as up to 2 microns or up to 3 microns in thickness. The lightly doped p-type GaN of the p-base layer 410 may include a p-type dopant at a concentration in a range from about $1\times10^{18}$ to about $1\times10^{19}$ cm$^{-3}$. The p-type dopant may comprise Mg or Mn.

Each of the buried p-regions 418 may extend a length $L_{p,ohm}$ in the radial direction in a range from about 50 microns to about 400 microns. Each of the buried p-bases 420 may extend a length $L_{p,Sch}$ in the radial direction in a range from about 1 micron to about 7 microns. The p-termination section 424 may extend a length $L_T$ in the radial direction in a range from about 2 microns to about 4 microns. Each of the drift regions 406r may have a length $L_N$ in a radial direction in a range from about 1 micron to about 2 microns, where the length $L_N$ also represents a separation distance between the buried p-bases 420.

In some examples, the buried p-region 418 may be located at a radial center of the diode 450. Regions of the BP-MPJ diode 450 including a buried p-region 418 may be referred to as p-i-n sections, while regions including the buried p-bases 420 may be referred to as junction barrier Schottky (JBS) sections of the BP-MPJ diode 450. In some examples, some or all of the buried p-bases 420 may be Schottky in nature. Alternatively, some or all of the buried p-bases 420 may be ohmic in nature, enabled by an additional p$^+$ layer 412 atop each such buried p-base 420. The p-bases 420 that are Schottky in nature do not include the p$^+$ layer.

The anode layer 424 may comprise a metal or alloy including platinum, palladium, and/or nickel. Also or alternatively, the cathode layer 402 may comprise a metal or alloy including aluminum, nickel, gold, and/or titanium. The BP-MP J diode 450 may have a cylindrical shape, as shown for an exemplary PI-MP J diode 400 in FIG. 6. Alternatively, the BP-MPJ diode 450 may have a square-raster or honeycomb structure, wherein the radial direction referred to above is a lateral direction.

FIG. 4C schematically shows a close-up view of the SAG compatible structure 500 of the buried p-bases 420. The buried p-regions 418 of the BP-MPJ diode 550 may also exhibit this structure. FIGS. 8A-8I show an exemplary SNS-SAG process flow to form a buried p-base 420 having a SAG compatible structure 500. The method is consistent with that shown in FIGS. 1A-1E except that the SNS-SAG process is carried out twice in FIGS. 8A-8I to create (1) n-doped regions that may ultimately become the drift regions 406r and (2) p-doped regions that may ultimately become the buried p-bases 420 of the PI-MPJ and BP-MPJ diodes 400,450. In addition, the SAG compatible structure 500 of buried layers (e.g., the buried p-base 420) that may result from SNS-SAG processing is illustrated. To be clear, any buried layers described in this disclosure (e.g., buried p-bases and/or buried p-regions of the MPS and/or MP J diodes) may be fabricated using SNS-SAG and may have the SAG compatible structure 500.

Figure 8A:
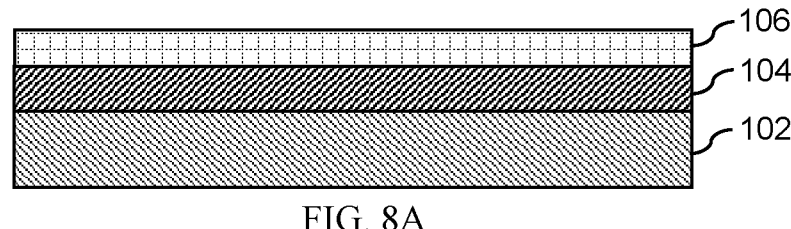
Figure 8B:
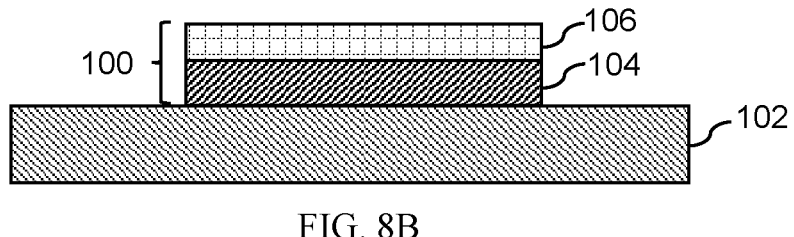

Referring to FIGS. 8A and 8B, a bilayer mask 100 that includes a first dielectric layer 104 on the semiconductor substrate 102 and a second dielectric layer 106 on the first dielectric layer 104, is formed as described above. The first dielectric layer 104 may comprise silicon nitride and the second dielectric layer 106 may comprise silicon oxide. The semiconductor substrate 102 may comprise GaN and may include the field stop layer 404 and the drift layer 406 described above in reference to the MPJ diodes 400,450.

Figure 8C:
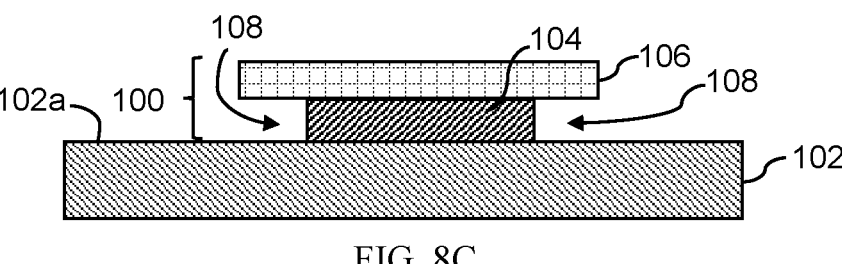
Figure 8D:
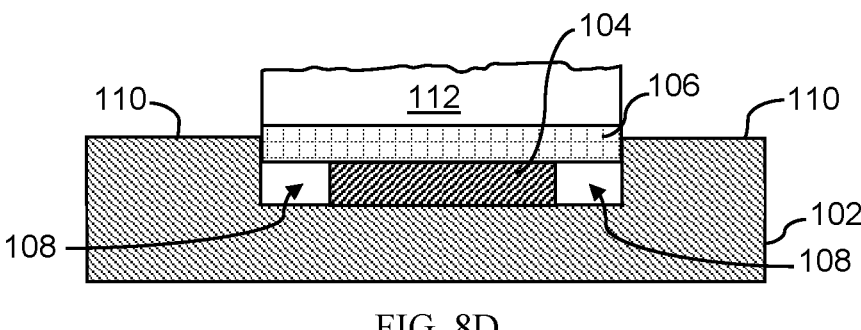
Figure 8E:
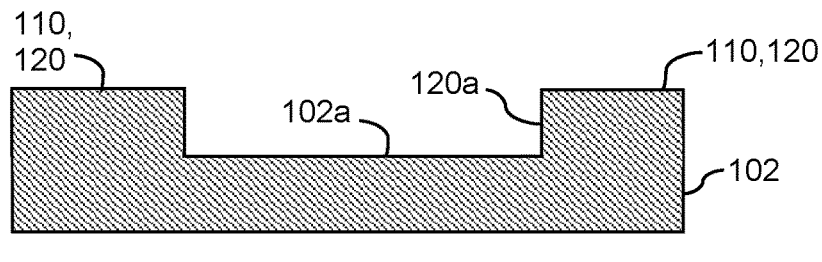
Figure 8F:
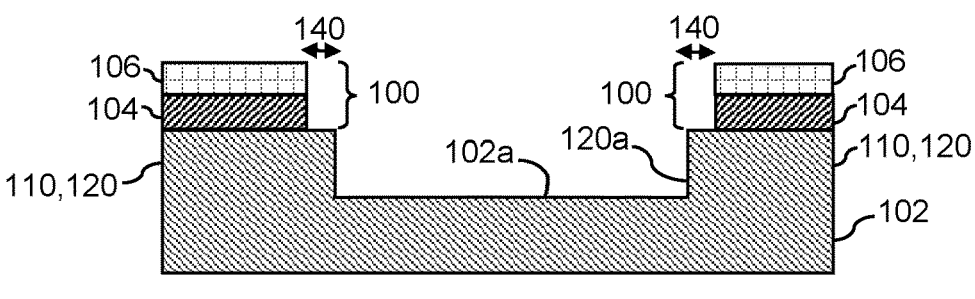
Figure 8G:
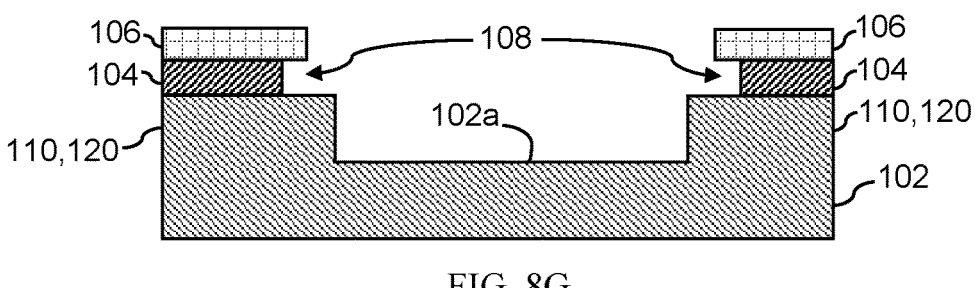
Figure 8H:
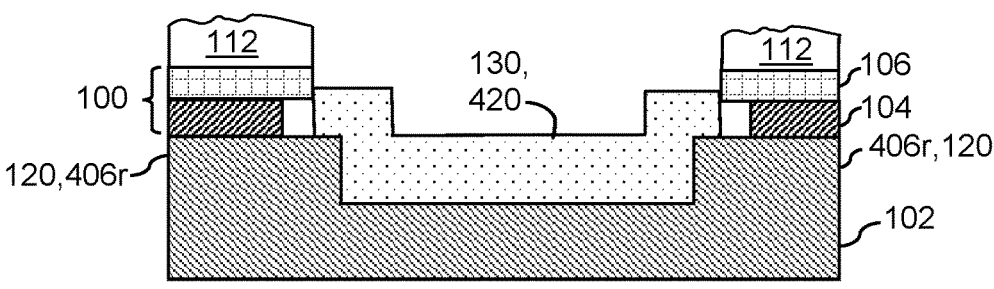

FIG. 8C shows formation of an undercut region 108 by selective etching of the first dielectric layer 104, also as described above. In FIG. 8D, a crystalline semiconductor material 110 is epitaxially grown on the substrate 102 and a polycrystalline semiconductor material 112 is deposited on the mask 100. In this example, the crystalline semiconductor material 110 may comprise n-doped GaN. After epitaxial growth, the bilayer mask 100 and the polycrystalline semiconductor material 112 are removed, leaving behind mesas 120 comprising the crystalline semiconductor material 110, as shown in FIG. 8E. As described in detail above, the mesas 120 may have sidewalls 120a with exceptional smoothness and low defect density. Another bilayer mask 100 is formed on each mesa 120, as shown in FIG. 8F, prior to epitaxial growth on the exposed portion 102a of the substrate 102. Notably, in order to ensure that the regrowth covers the exposed portion 102a and extends to the surrounding mesas 120, the bilayer mask 100 is not flush with the sidewalls 120a of the mesas 120, but instead is recessed, so as to comprise a lateral offset 140 with respect to the sidewall 120a and the exposed portion 102a of the substrate 102, as illustrated. The undercut region 108 of the mask 100 is formed as described above and as shown in FIG. 8G, and then epitaxial growth of a crystalline semiconductor material 110, in this case p-doped GaN, is carried out on the exposed portion 102a while a polycrystalline semiconductor material 112 is deposited on the bilayer mask 100, as shown in FIG. 8H, forming a buried layer 130 in the semiconductor substrate 102. The bilayer mask 100 and the polycrystalline semiconductor material 112 are then removed, leaving behind the buried layer 130 (e.g, the buried p-base 420), over which an anode layer 414,424 may be deposited and patterned, as illustrated in FIG. 8I. Notably, the buried p-base 420 (which alternatively could be a buried p-region 418), includes ledges 460 that overhang the adjacent drift regions 406r. Each ledge 460 has a length $L_{Ext}$ that is typically less than $L_{P,Sch}$ Or $L_{P,ohm}$ (e.g., between 0.1 and 0.5 of $L_{P,Sch}$ or $L_{P,ohm}$) and which typically lies in a range from about 0.5 micron to about 2 microns. A thickness of each ledge may be determined by the epitaxial growth process.

Experimental Example

To assess the efficacy of SNS-SAG in producing low-leakage sidewalls in comparison with existing methods, two Schottky barrier diode (SBD) structures are fabricated using SNS-SAG and ICP-RIE. A 1.5 μm-thick UID drift layer is grown atop a 330 μm-thick bulk GaN substrate ($n > 1 \times 10^{18}$ $cm^{-3}$). Then, on half the sample, a bilayer mask comprising $Si_3N_4$ (0.4 μm thick) and $SiO_2$ (1 μm thick) is deposited and patterned, and the other half is left bare. A hot $H_3PO_4$ wet etch treatment is employed to selectively etch the $Si_3N_4$ and form the undercut region, as described above. An additional 1 μm is grown on the sample. In the patterned region, this results in SNS-SAG mesas, while growth in the bare region is planar. The planar region is then etched using the ICP-RIE technique to produce mesas parallel to the SNS-SAG mesas. FIG. 9A shows a post-growth cross-sectional scanning electron microscopy (SEM) image of the undercut bilayer mask ($SiO_2/Si_3N_4$) on the GaN substrate, and FIG. 9B shows a SEM image of the side-by-side mesas formed by SNS-SAG and ICP-RIE.

The I-V characteristics of both structures are shown in FIG. 10. The SNS-SAG grown SBD shows an improvement by more than four orders of magnitude in leakage current compared to its ICP-RIE counterpart, validating the fact that SNS-SAG is a promising technique leading to high-efficiency GaN power device structures. By nature, the sidewalls should have defect densities comparable to planar epitaxy and thus the grown mesas have minimal defects and leakage. The only difference in processing the SBD structures for the ICP-RIE and SNS-SAG cases is the sidewall. Therefore, the large leakage component associated with ICP-RIE processed SBDs can be attributed to the sidewall leakage component.

Computational Examples

The design of exemplary devices is performed using two-dimensional (2D) simulations with a technology computer-aided design (TCAD) tool. GaN material parameters for forward-bias simulations are obtained from the literature. Reverse-bias simulation parameters used in this work have been previously published (Sarker et al., *IEEE J. Electron Devices Soc.,* 9 (2020) pp. 68-78). Since the design is heavily reliant on reducing leakage due to tunneling, a nonlocal tunneling model is employed. Also used is $A^{**} = 26$ $A\,cm^{-2}\,K^{-2}$. Unless otherwise stated, nickel (Ni) is used as anode metal with a work function, $\Phi_M = 5.2$ eV, which is extrapolated from experimental results. The device structures of these examples include a drift layer thickness, $t_{dr} = 15$ μm, and a drift layer doping concentration, $N_{dr} = 5 \times 10^{15}$ $cm^{-3}$. For the p-bases, a net Mg-doping concentration of $N_{Mg} = 1 \times 10^{19}$ $cm^{-3}$ is used. In all cases, a p-ohmic contact resistivity of $\rho_c \sim 0.15$ m Ω $cm^2$ is assumed in accordance with experimentally reported values. Finally, unless otherwise mentioned, the thickness of the p-bases (or p-layers) is 500 nm. For forward current density, $J_{FC}$, the current is normalized to the total anode area. On the other hand, for $J_{leak}$, the current is normalized to the total non-ohmic anode area to account for the correct leakage current density. This approach avoids underestimating $J_{leak}$ values. Both MPS and MPJ diode designs are investigated.
MPS Diodes As described above, there are two basic variants of the MPS diodes, namely, PI-MPS diodes and BP-MPS diodes. Schematic diagrams of the half-structures of the variants are illustrated in FIGS. 3A and 3B with p-i-n diode (PND) and Schottky barrier diode (SBD) section lengths of $L_P$ and $L_N$, as shown. The MPS diodes effectively pinch the leakage through the intermittent SBD sections because of a depletion region that extends laterally into the SBD sections and throttles leakage channels during reverse bias. This may result in the Schottky anode being shielded from the cathode and a reduction in surface electric field, $E_s$, which is called the reduced surface field (RESURF) effect.

Figure 11:
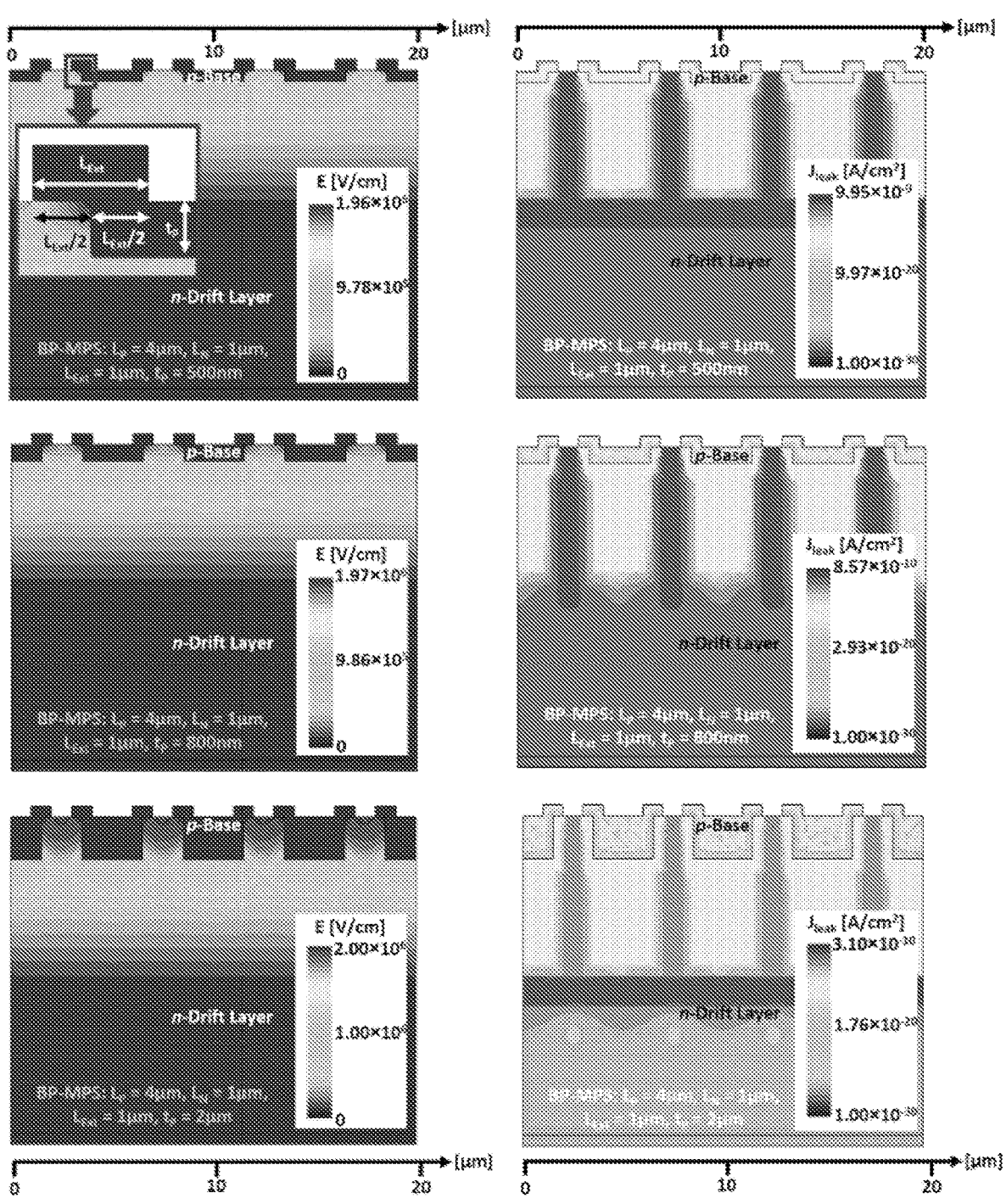
FIG. 11 shows simulated E and $J_{leak}$ profiles at a reverse bias, $V_R$=200 V for SAG-compatible BP-MPS diode structures including buried p-regions having different depths $t_p$ (500 nm, top; 800 nm, middle; 2 microns, bottom).
Figure 12:
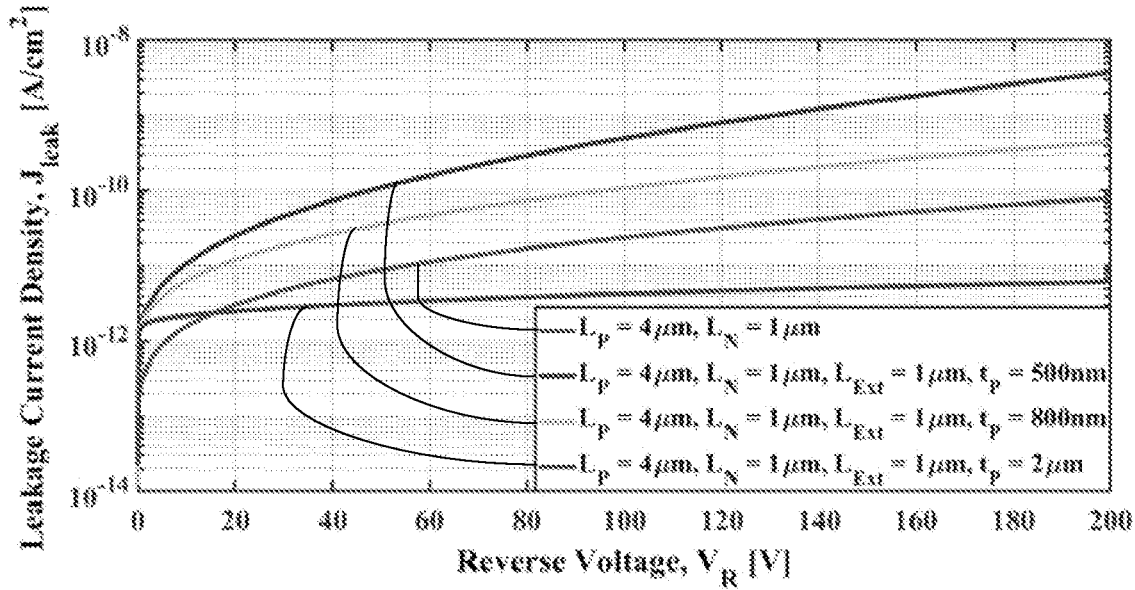
FIG. 12 plots $J_{leak}$ as a function of $V_R$ for the SAG-compatible BP-MPS diode structures having buried p-regions of different depths $t_p$ (500 nm; 800 nm; 2 microns).

Simulations suggest that BP-MPS diodes may represent a more practical option for high-speed high-power diode choice than the PI-MPS diodes, and are capable of providing a strong RESURF effect. FIG. 11 shows simulated E and $J_{leak}$ profiles at a reverse bias, $V_R = 200$ V for SAG-compatible BP-MPS diode structures including buried p-regions having different depths $t_p$ (500 nm, top; 800 nm, middle; 2 microns, bottom). Relevant dimensions are indicated in the inset at the top E profile, where for all cases $L_{Ext} = 1$ micron. From $t_p = 500$ nm to $t_p = 800$ nm, there is no significant RESURF effect. However, for $t_p = 2$ μm, there is indeed a tangible RESURF effect. This shows up as an improvement in maximum $J_{leak}$ by more than an order of magnitude, as shown in FIG. 12, which plots $J_{leak}$ as a function of $V_R$ for these three examples. Also included is the $J_{leak}$ versus $V_R$ plot for the regular BP-MPS case. Clearly, the regular BP-MPS case offers a lower leakage compared to $t_p = 500$ nm, 800 nm cases for the modified BP-MPS structure. This is not surprising, given the fact that the modified structure is a hybrid form of PI-MPS and BP-MPS structures, so formed to accommodate SAG processing. This modification dilutes the RESURF effect seen in the regular BP-MPS structure due to the presence of short PI-MPS sections on both sides of each Schottky anode section. The problem may be overcome by adopting $t_P=2$ μm case. Not only is there an improvement in $J_{leak}$ by more than an order in comparison to the regular BP-MPS structure, but also the curve is also amazingly flat in nature, indicating a very strong RESURF effect.

Figure 13:
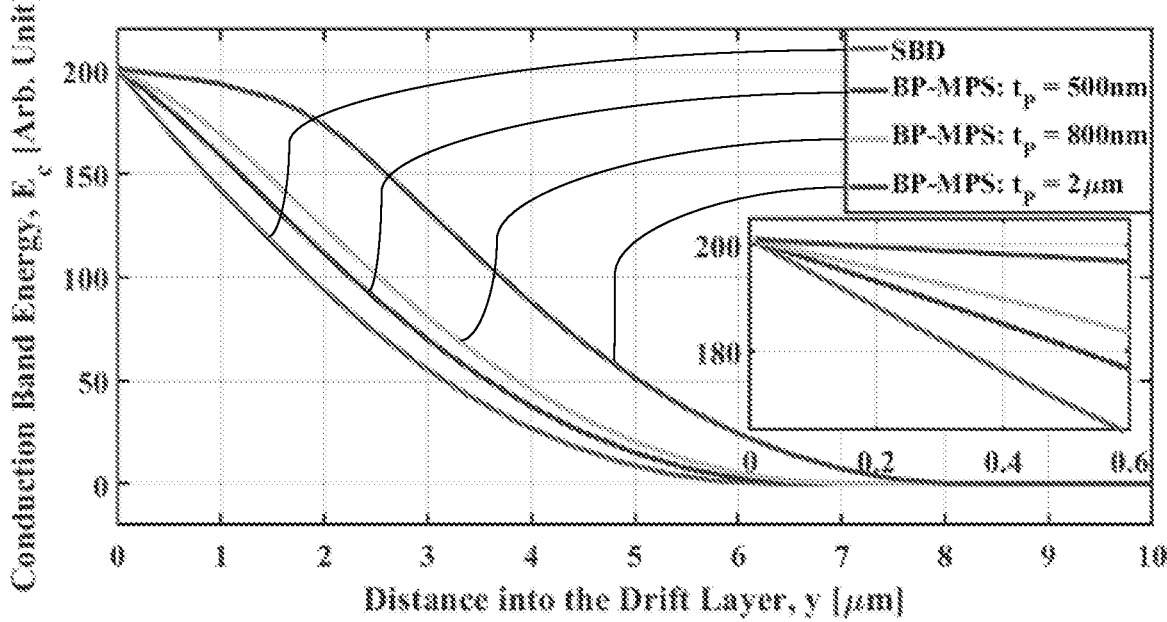
FIG. 13 plots conduction band edge, $E_c$, versus the depth into the drift layer, y for the SAG-compatible BP-MPS diode structures having buried p-regions of different depths $t_p$.

To understand the RESURF effect in SAG compatible BP-MPS structures, conduction band edge, $E_c$, is plotted versus the depth into the drift layer, y in FIG. 13. For the SBD, the barrier is the thinnest and it has the highest slope in the energy profile. On the other hand, for $t_P=500$ nm, the barrier is thicker. Thus, the BP-MPS reduces the nonlocal tunneling through the barrier. With the increase in $t_P$, the barrier thickness increases while the slope in the energy band decreases. Since component of the electric field perpendicular to Schottky anode, Ey is given as:

$$|E_y(y)| = \frac{1}{q} \cdot \left| \frac{dE_c(y)}{dy} \right|,$$

where q is the electron charge, this explains how the reduction in the slope of the $E_c$ profile gives rise to the RESURF effect.

For the SAG compliant design with $t_P=2$ μm, the presence of short PI-MPS sections on both sides diluting the RESURF effect may be countered by very thick buried p-base layers aligning field vectors parallel to the Schottky anode. This may enable a very large RESURF effect, not only reducing $J_{leak}$, but also making the curve essentially flat. The RESURF effects for various exemplary structures discussed are listed in Table 1.

TABLE 1

Estimation of RESURF effects in various diodes.

| Device structure | $E_{S,\ max}$ (MV cm$^{-1}$) | % RESURF |
|---|---|---|
| SBD | 0.638 | — |
| PI-MPS: $L_N = 75$ nm | 0.192 | 69.88 |
| PI-MPS: $L_P = 8$ μm, $L_N = 2$ μm | 0.627 | 1.79 |
| PI-MPS: $L_P = 4$ μm, $L_N = 1$ μm | 0.613 | 4.0 |
| BP-MPS: $L_P = 8$ μm, $L_N = 2$ μm | 0.405 | 36.51 |
| BP-MPS: $L_P = 4$ μm, $L_N = 1$ μm | 0.176 | 72.49 |
| BP-MPS (SAG): $t_p = 500$ nm | 0.398 | 37.69 |
| BP-MPS (SAG): $t_p = 800$ nm | 0.280 | 56.12 |
| BP-MPS (SAG): $t_p = 2$ μm | 0.080 | 87.41 |

RESURF is calculated from the simple formula, RESURF (%) = [$E_{S,\ max}$ (SBD) − $E_{S,\ max}$] × 100/$E_{S,\ max}$ (SBD). All the values are calculated at $V_R = 200$ V. For all BP-MPS (SAG) cases, $L_P = 4$ μm, $L_N = 1$ μm. and $L_{EXT} = 1$ μm.

The ratio, $L_P/L_N$ may determine important factors such as RR performance and the maximum operating frequency, $f_{op}$. $L_N$, on the other hand, cannot be too small ($L_N<1$ μm is not practical) because of the limit on photolithographic resolution and SNS-SAG aspect ratio, $t_P/L_N$. For example, the maximum $t_P$ value used in this work results in an aspect ratio of 2. Anything beyond $t_P>2$ μm may not be very practical from the SNS-SAG point of view. Because $L_{Ext}<1$ μm is not practical, $L_P \geq 2$ μm may be understood to be the limiting case. Practical limits are: $L_P \geq 2$ μm, $L_N \geq 1$ μm, $t_P \leq 2$ μm, and $L_{Ext} \geq 1$ μm. Therefore, in one example, suitable dimensions may be: $L_P=8$ μm (no extra surging beyond 8 μm), $L_N=1$ μm, $t_P=2$ μm, and $L_{Ext}=1$ μm.

MPJ Diodes

In the preceding section, SAG compatible BP-MPS diodes were described. Below, the focus is on reducing $J_{leak}$ further and, also, spreading the leakage current to a larger area to avoid possible premature breakdown scenarios resulting from otherwise overlooked details. A different breed of mixed-conduction diodes is discussed in this section. In an exemplary design, all of the p-bases (or SBD sections) of an MPS diode are lumped together. The major problem in this design is the large leakage in the absence of a RESURF effect in the single lumped SBD section. Therefore, a RESURF effect may be introduced in this single SBD section by considering a junction barrier Schottky (JBS) section, which can eventually replace the lumped SBD section. When the lumped SBD section is replaced by the JBS section, the RESURF effect can effectively stem the leakage in the new lumped p-base MPS diode. This structure is referred to as the merged p-i-n JBS (MPJ) diode, which includes two variants, namely, the p-islet MPJ (PI-MPJ) diode and buried p-base MPJ (BP-MPJ) diode, as shown schematically in FIGS. 4A and 4B. From a processing point of view, the BP-MPJ and the PI-MPJ diodes have similar complexity. However, the BP-MPJ diode may be preferred for two reasons: (1) the BP-MPJ diode results in nominally larger bipolar current density and (2) the PI-MPJ diode may have a slightly larger leakage around the border of the large ohmic p-islet base and the JBS section, due to the p-islet nature of the large ohmic p-base. The SAG compatible structure 500 shown in FIG. 4C is to be implicitly assumed in all the designs described below. The general schematic diagram of these designs appears in FIG. 7, and details of the design examples appear in Table 2.

TABLE 2

Specifics of various BP-MPJ diode designs.

| Design # | $R_D$ (μm) | $t_p$ (μm) | $L_{P,ohm}$ (μm) | $L_{P,Sch}$ (μm) | $N_P$ | $N_{Sch}$ |
|---|---|---|---|---|---|---|
| 1 | 153 | 2 | 240 | 2 | 1 | 10 |
| 2 | 154 | 2 | 80 | 2 | 3 | 5 |
| 3 | 153 | 2 | 240 | 2 | 1 | 10 |
| 4 | 154.5 | 2 | 60 | 2 | 4 | 4 |
| 5 | 154.5 | 2 | 60 | 3 | 4 | 3 |
| 6 | 154.5 | 0.5 | 60 | 3 | 4 | 3 |
| 7 | 155 | 0.5 | 240 | 3 | 1 | 8 |

In all cases except Design #1, all p-sections in the JBS grid are Schottky in nature. In Design #3, of the ten p-contacts in the JBS section, $p_2$, $p_4$, $p_6$, $p_8$, and $p_{10}$ are Schottky in nature, while the rest are ohmic in nature. Other than this difference, Designs #1 and #3 are identical in every aspect. $N_P$ and $N_{Sch}$ indicate the total number of p-bases and the number of Schottky p-contacts in a JBS section, respectively. Also, $L_{Ext} = L_N = 1$ μm and $L_r = 4$ μm.

Figure 14:
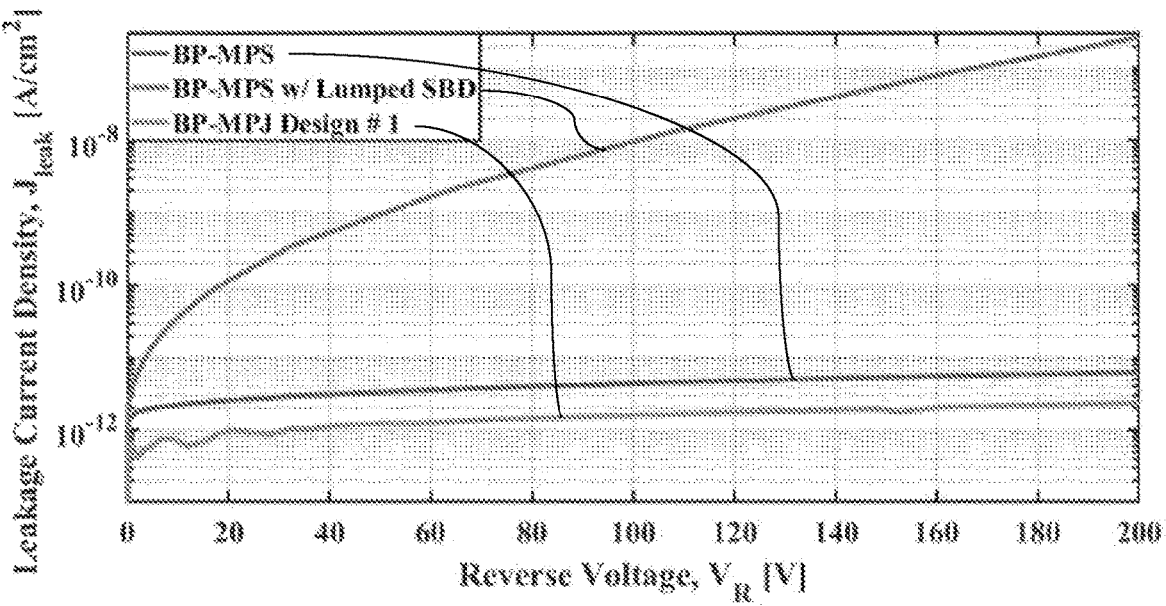
FIG. 14 plots leakage current density $J_{leak}$ versus $V_R$ for BP-MP J Design #1, the BP-MPS diode with lumped SBD, and the regular BP-MPS diode.

The comparison of $J_{leak}$ versus $V_R$ plots of BP-MPJ Design #1 with those of BP-MPS diode with lumped SBD and the regular BP-MPS diode appears in FIG. 14. Clearly, the integration of the JBS grid with BP-MPS diode with lumped p-base MPS diode to replace lumped SBD section does introduce RESURF effect successfully and reduces leakage by ~5 orders of magnitude. Significantly, it also reduces $J_{leak}$ level below that of the regular BP-MPS diode. From FIG. 14, at a first glance, the level of improvement provided by the BP-MPJ Design #1 over the regular BP-MPS diode might seem minuscule; however, a careful examination of the scenario reveals a surprising picture. In the BP-MPS diode, there is a single large leakage spot centered around the p-termination corner. In contrast, the BP-MPJ Design #1 has small distributed leakage spots with >3 orders of magnitude improvement in maximum localized $J_{leak}$ values. In fact, Design #1 manages to reduce maximum localized E by ~10% at $V_R=200$ V. The picture becomes grimmer for the BP-MPS diode for larger $V_R$ with the single large leakage spot exacerbating the situation. By distributing JBS grid throughout the device rather than one lumped section in the periphery, it is possible to achieve two goals: (1) reducing the total leakage at any one spot and (2) reducing maximum localized $J_{leak}$ by >22%.

Figure 15:
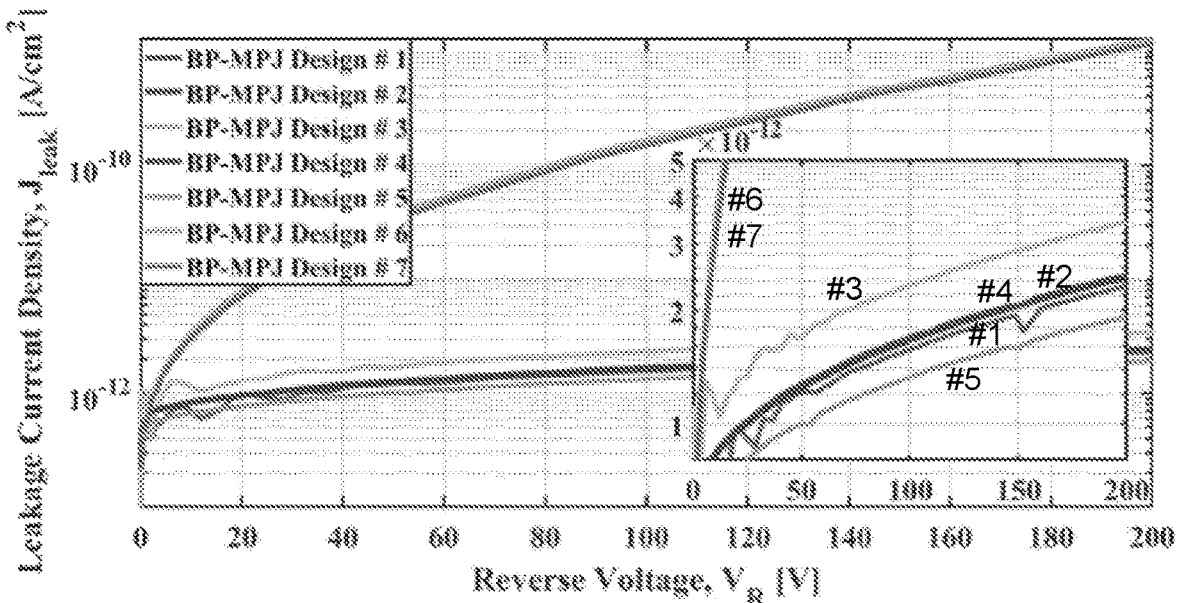
FIG. 15 plots leakage current density $J_{leak}$ versus $V_R$ for the exemplary BP-MPJ designs proposed in Table 2.
Figure 16:
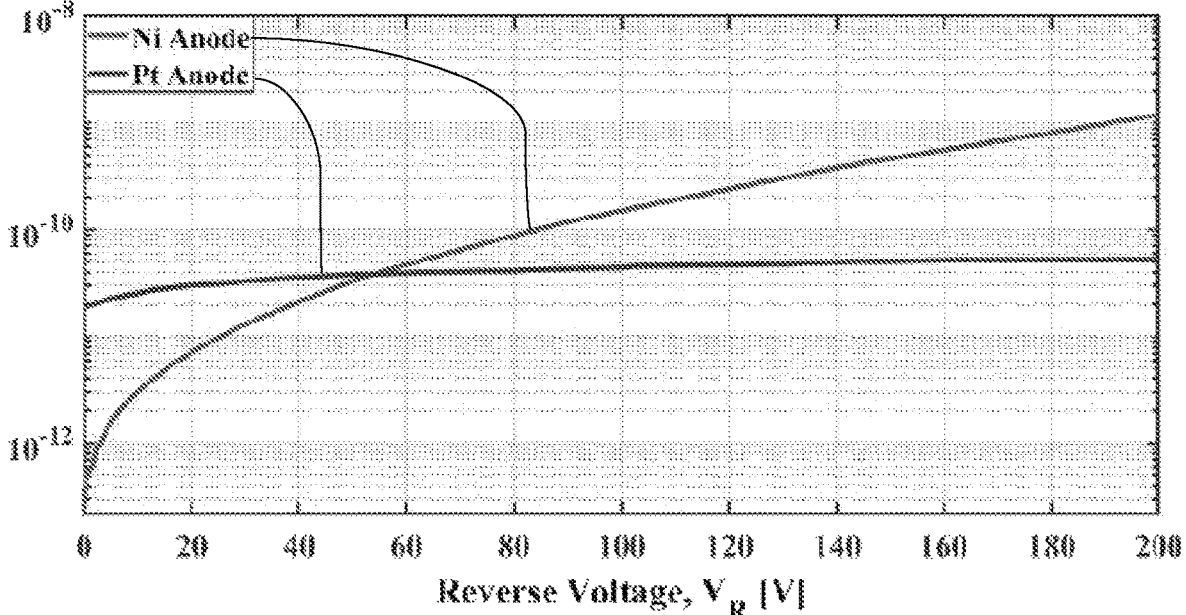
FIG. 16 plots leakage current density $J_{leak}$ versus $V_R$ for BP-MP J Design #6 for nickel (Ni) and platinum (Pt) anodes.

A comparison of $J_{leak}$ versus $V_R$ for all the exemplary designs in Table 2 is shown in FIG. 15. It may be mentioned that Design #5 is almost identical to Design #4, but wider Schottky p-sections are used to reduce $J_{leak}$ and localized total leakage further. Indeed Design #5 is the best performer. In practice, Schottky p-sections can be made wider with each JBS section width unchanged to improve performance further. Designs #6 and #7 demonstrate that reduction in $t_P$ may be detrimental to performance. Finally, plots of $J_{leak}$ versus $V_R$ for Ni and platinum (Pt) anodes for Design #6 appear in FIG. 16. For the simulation, $\Phi_M$=5.64 eV is employed. Whereas Design #6 failed to garner the level of RESURF effect achieved by Designs #1 through #5, by using Pt with larger Schottky barrier, the leakage scenario drastically improves. Thus, employing Pt as the anode metal may be another effective way of tackling leakage. Finally, the whole design procedure is performed while maintaining a constant ratio (~4) of total ohmic p-base width to that of the total Schottky (SBD or JBS sections) for a certain RR transient setting. Other ratios can be designed in a similar manner. For the sake of uniformity, the anode radius, $R_D$ is kept almost constant.

Although the present invention has been described in considerable detail with reference to certain embodiments thereof, other embodiments are possible without departing from the present invention. The spirit and scope of the appended claims should not be limited, therefore, to the description of the preferred embodiments contained herein.

All embodiments that come within the meaning of the claims, either literally or by equivalence, are intended to be embraced therein. Furthermore, the advantages described above are not necessarily the only advantages of the invention, and it is not necessarily expected that all of the described advantages will be achieved with every embodiment of the invention.

The invention claimed is:

1. A merged p-i-n junction barrier controlled Schottky diode comprising:
   a cathode layer;
   a field stop layer on the cathode layer, the field stop layer comprising heavily doped n-type GaN;
   a drift layer on the field stop layer, the drift layer comprising lightly doped or unintentionally doped n-type GaN;
   a p-islet on the drift layer, the p-islet comprising:
     a p-base layer comprising lightly doped p-type GaN; and
     a p$^+$ layer on the p-base layer, the p$^+$ layer comprising heavily doped p-type GaN; and
   buried p-bases embedded in the drift layer and separated from each other in a radial direction by drift regions comprising the lightly doped n-type GaN, the buried p-bases comprising lightly doped p-type GaN and optionally being positioned radially outward from the p-islet; and
   an anode layer having a first portion overlying the p-islet and a second portion overlying the buried p-bases and the drift regions,
   wherein a last of the buried p-bases in the radial direction is a p-termination section, and wherein the p-termination section extends farther in the radial direction than the second portion, thereby ensuring termination of the anode layer on p-type GaN, and wherein a sidewall of each of the buried p-bases and the p-islet is substantially smooth and/or defect-free.

2. The merged p-i-n junction barrier controlled Schottky diode of claim 1, wherein, when operated under a reverse bias of 200 V, the merged p-i-n junction barrier controlled Schottky diode exhibits a leakage current density of about $1\times10^{-4}$ A/cm$^2$ or less.

3. The merged p-i-n junction barrier controlled Schottky diode of claim 1, wherein the sidewall of each of the buried p-bases and the p-islet exhibits a root mean squared (RMS) surface roughness less than about 1 nm.

4. The merged p-i-n junction barrier controlled Schottky diode of claim 1, wherein the heavily doped n-type GaN includes an n-type dopant at a concentration in range from $1\times10^{18}$ cm$^{-3}$ to about $1\times10^{19}$ cm$^{-3}$, and/or
   wherein the lightly doped or unintentionally doped n-type GaN includes an n-type dopant at a concentration in a range from about $8\times10^{15}$ cm$^{-3}$ to about $2\times10^{16}$ cm$^{-3}$.

5. The merged p-i-n junction barrier controlled Schottky diode of claim 1, wherein the heavily doped p-type GaN includes a p-type dopant at a concentration in range from about $2\times10^{19}$ to about $2\times10^{20}$ cm$^{-3}$, and/or
   wherein the lightly doped p-type GaN includes a p-type dopant at a concentration in a range from about $1\times10^{18}$ to about $1\times10^{19}$ cm$^{-3}$.

6. The merged p-i-n junction barrier controlled Schottky diode of claim 1, further comprising a number of the p-islets radially spaced apart on the drift layer.

7. The merged p-i-n junction barrier controlled Schottky diode of claim 1, wherein each of the buried p-bases include ledges overhanging adjacent drift regions.

8. A merged p-i-n junction barrier controlled Schottky diode comprising:
   a cathode layer;
   a field stop layer on the cathode layer, the field stop layer comprising heavily doped n-type GaN;
   a drift layer on the field stop layer, the drift layer comprising lightly doped or unintentionally doped n-type GaN;
   a buried p-region embedded in the drift layer, the buried p-region comprising:
     a p-base layer comprising lightly doped p-type GaN; and
     a p$^+$ layer on the p-base layer, the p$^+$ layer comprising heavily doped p-type GaN; and
   buried p-bases embedded in the drift layer and separated from each other in a radial direction by drift regions comprising the lightly doped n-type GaN, the buried p-bases comprising lightly doped p-type GaN and optionally being positioned radially outward from the buried p-region; and
   an anode layer overlying the buried p-region, the buried p-bases and the drift regions,
   wherein a last of the buried p-bases in the radial direction is a p-termination section, and wherein the p-termination section extends farther in the radial direction than the anode layer, thereby ensuring termination of the anode layer on p-type GaN, and
   wherein a sidewall of each of the buried p-bases and the buried p-region is substantially smooth and/or defect-free.

9. The merged p-i-n junction barrier controlled Schottky diode of claim 8, wherein, when operated under a reverse bias of 200 V, the merged p-i-n Schottky diode exhibits a leakage current density of about $1\times10^{-4}$ A/cm$^2$ or less.

10. The merged p-i-n junction barrier controlled Schottky diode of claim 8, wherein the sidewall of each of the buried p-bases and the buried p-region exhibits a root mean squared (RMS) surface roughness less than about 1 nm.

11. The merged p-i-n junction barrier controlled Schottky diode of claim 8, wherein the heavily doped n-type GaN includes an n-type dopant at a concentration in range from about $1 \times 10^{18}$ cm$^{-3}$ to about $1 \times 10^{19}$ cm$^{-3}$, and/or wherein the lightly doped or unintentionally doped n-type GaN includes an n-type dopant at a concentration in a range from about $8 \times 10^{15}$ cm$^{-3}$ to about $2 \times 10^{16}$ cm$^{-3}$.

12. The merged p-i-n junction barrier controlled Schottky diode of claim 8, wherein the heavily doped p-type GaN includes a p-type dopant at a concentration in range from about includes a p-type dopant at a concentration in range from about $2 \times 10^{19}$ to about $2 \times 10^{20}$ cm$^{-3}$, and/or wherein the lightly doped p-type GaN includes a p-type dopant at a concentration in a range from about $1 \times 10^{18}$ to about $1 \times 10^{19}$ cm$^{-3}$.

13. The merged p-i-n junction barrier controlled Schottky diode of claim 8, further comprising a plurality of the buried p-regions radially spaced apart in the drift layer.

14. The merged p-i-n junction barrier controlled Schottky diode of claim 8, wherein each of the buried p-bases include ledges overhanging adjacent drift regions.

\*    \*    \*    \*    \*